(12) United States Patent
Huang et al.

(10) Patent No.: US 11,761,557 B2
(45) Date of Patent: Sep. 19, 2023

(54) ELECTRIC VALVE, HEAT MANAGEMENT ASSEMBLY AND AIR CONDITIONING SYSTEM

(71) Applicant: ZHEJIANG SANHUA INTELLIGENT CONTROLS CO., LTD., Zhejiang (CN)

(72) Inventors: Quanfeng Huang, Zhejiang (CN); Lulu Zhang, Zhejiang (CN); Rongrong Zhang, Zhejiang (CN); Dazhao Zha, Zhejiang (CN); Yingchong Lu, Zhejiang (CN); Wei Zhang, Zhejiang (CN)

(73) Assignee: ZHEJIANG SANHUA INTELLIGENT CONTROLS CO., LTD, Zhejiang (CN)

( * ) Notice: Subject to any disclaimer, the term of this patent is extended or adjusted under 35 U.S.C. 154(b) by 319 days.

(21) Appl. No.: 17/278,276

(22) PCT Filed: Nov. 27, 2019

(86) PCT No.: PCT/CN2019/121183
§ 371 (c)(1),
(2) Date: Mar. 19, 2021

(87) PCT Pub. No.: WO2020/108514
PCT Pub. Date: Jun. 4, 2020

(65) Prior Publication Data
US 2021/0270384 A1 Sep. 2, 2021

(30) Foreign Application Priority Data

Nov. 28, 2018 (CN) .......................... 201811433437.9
Nov. 28, 2018 (CN) .......................... 201811435988.9

(51) Int. Cl.
*F16K 37/00* (2006.01)
*F25B 41/34* (2021.01)
(Continued)

(52) U.S. Cl.
CPC .............. *F16K 37/005* (2013.01); *F16K 1/32* (2013.01); *F16K 31/046* (2013.01);
(Continued)

(58) Field of Classification Search
CPC .. F16K 31/046; F25B 41/34; F25B 2700/191; F25B 2700/21
See application file for complete search history.

(56) References Cited

U.S. PATENT DOCUMENTS 8,596,133 B2    12/2013   Lee et al.
9,103,354 B2 *   8/2015   Yahagi ................... B60T 8/368
(Continued)

FOREIGN PATENT DOCUMENTS

CN    201402151 Y    2/2010
CN    205693556 U    11/2016
(Continued)

OTHER PUBLICATIONS

The State Intellectual Property Office of People's Republic of China, The Second Office Action; dated May 11, 2021 to application No. CN 201811433437.9, 13 pages.
(Continued)

*Primary Examiner* — Eric Keasel
(74) *Attorney, Agent, or Firm* — Hunton Andrews Kurth LLP

(57) ABSTRACT

Provided are an electric valve, a thermal management assembly, and an air conditioning system. The electric valve includes a valve body, a circuit board, and a sensor. The valve body has a passage, and the sensor is connected to the circuit board in at least one of an electric connection mode
(Continued)

and a signal connection mode. The sensor is configured to detect at least one of a pressure or a temperature of a working medium in the passage. At least one of the valve body or a housing of the sensor includes a metal portion, and a reference ground of the circuit board is electrically connected directly or indirectly to the metal portion.

18 Claims, 17 Drawing Sheets

(51) Int. Cl.
    *F16K 1/32*       (2006.01)
    *F16K 31/04*     (2006.01)
    *F25B 41/35*     (2021.01)

(52) U.S. Cl.
    CPC .......... *F16K 37/0025* (2013.01); *F25B 41/34* (2021.01); *F25B 41/35* (2021.01); *F25B 2700/191* (2013.01); *F25B 2700/21* (2013.01)

(56) References Cited

U.S. PATENT DOCUMENTS

| | | | |
|---|---|---|---|
| 9,366,353 B2 * | 6/2016 | Ooe | F16K 31/04 |
| 9,435,451 B2 * | 9/2016 | Shen | F16K 17/36 |
| 2007/0252431 A1 | 11/2007 | Tsunooka et al. | |
| 2014/0053545 A1 | 2/2014 | Yahagi et al. | |
| 2014/0291562 A1 | 10/2014 | Ooe et al. | |
| 2015/0048266 A1 | 2/2015 | Shen et al. | |

FOREIGN PATENT DOCUMENTS

| | | |
|---|---|---|
| CN | 106463904 A | 2/2017 |
| CN | 106663159 A | 5/2017 |
| CN | 106710883 A | 5/2017 |
| CN | 206294411 U | 6/2017 |
| CN | 107620824 A | 1/2018 |
| CN | 207049366 U | 2/2018 |
| CN | 107797079 A | 3/2018 |
| CN | 207364390 U | 5/2018 |
| CN | 108869830 A | 11/2018 |
| CN | 209495003 U | 10/2019 |
| EP | 1635157 A1 | 3/2006 |
| JP | H02199382 A | 8/1990 |
| JP | H0466470 U | 6/1992 |
| JP | 2009146962 A | 7/2009 |
| JP | 2016037902 A | 3/2016 |
| JP | 2016175554 A | 10/2016 |
| WO | 2014195309 A1 | 12/2014 |
| WO | 2018205746 A1 | 11/2018 |

OTHER PUBLICATIONS

International Search Report issued from the International Search Authority to Application No. PCT/CN2019/121183 dated Feb. 20, 2020, 4 pages.

Japanese Office Action, from the Japan Patent Office, issued to JP Application No. 2021-514542, dated Apr. 19, 2022, 12 pages.

Partial Supplementary European Search Report issued from the European Patent Office to EP Application No. 19888399.3 dated Apr. 20, 2022, 13 pages.

* cited by examiner

ELECTRIC VALVE, HEAT MANAGEMENT ASSEMBLY AND AIR CONDITIONING SYSTEM

CROSS-REFERENCE TO RELATED APPLICATIONS

This application is a 35 U.S.C. § 371 United States national stage application of co-pending International Patent Application No. PCT/CN2019/121183, filed on Nov. 27, 2019, which claims priority to Chinese Patent Application No. 201811435988.9 and Chinese Patent Application No. 201811433437.9, both filed on Nov. 28, 2018, the disclosures of which are incorporated herein by reference in their entireties.

TECHNICAL FIELD

The present application relates to the technical field of fluid control, for example, an electric valve, a thermal management assembly, and an air conditioning system.

BACKGROUND

In a refrigeration system, an electric valve is mainly used to regulate a flow rate of a refrigerant. With the increasing requirement for flow control accuracy, the electric valve is gradually applied in an automobile air conditioning system, a heat pump system and a battery cooling system.

The electric valve includes a circuit board, and the circuit board is provided with electronic components. Typically, during the operation of the electric valve, an external system or the electric valve itself will generate static electricity, and the static electricity will affect performance and operation of the electronic components, thus further affecting the operation of the electric valve.

SUMMARY

The present application provides an electric valve, a thermal management assembly, and an air conditioning system, facilitating improvement of electromagnetic compatibility of the electric valve.

An electric valve includes a valve body, a circuit board, and a sensor.

The valve body has a passage, the sensor is connected to the circuit board in at least one of an electric connection mode or a signal connection mode, and the sensor is configured to detect at least one of a pressure or a temperature of a working medium in the passage.

At least one of the valve body or a housing of the sensor includes a metal portion, and a reference ground of the circuit board is electrically connected directly or indirectly to the metal portion.

A thermal management assembly includes an electric valve and a heat exchanger, the electric valve is fixedly connected to the heat exchanger, and the electric valve is the above-mentioned electric valve.

An air conditioning system includes an evaporator and the above-mentioned electric valve.

The electric valve is arranged at an outlet of the evaporator, and the electric valve is configured to control a flow rate of a working medium at the outlet of the evaporator.

In the electric valve, the thermal management assembly, and the air conditioning system provided by the present application, the reference ground of the circuit board are electrically connected directly or indirectly to the metal portion, which is equivalent to the reference ground being electrically connected to the ground. In this way, it is beneficial to releasing low-frequency radiation on the circuit board, thereby facilitating suppressing electromagnetic noise and reducing interference of the circuit board to external circuits, such that the problem of low-frequency electromagnetic compatibility radiation is improved, thereby facilitating improvement of the electromagnetic compatibility of the electric valve.

DETAILED DESCRIPTION

The present application will be further described with reference to the accompanying drawings and embodiments.

Figure 1:
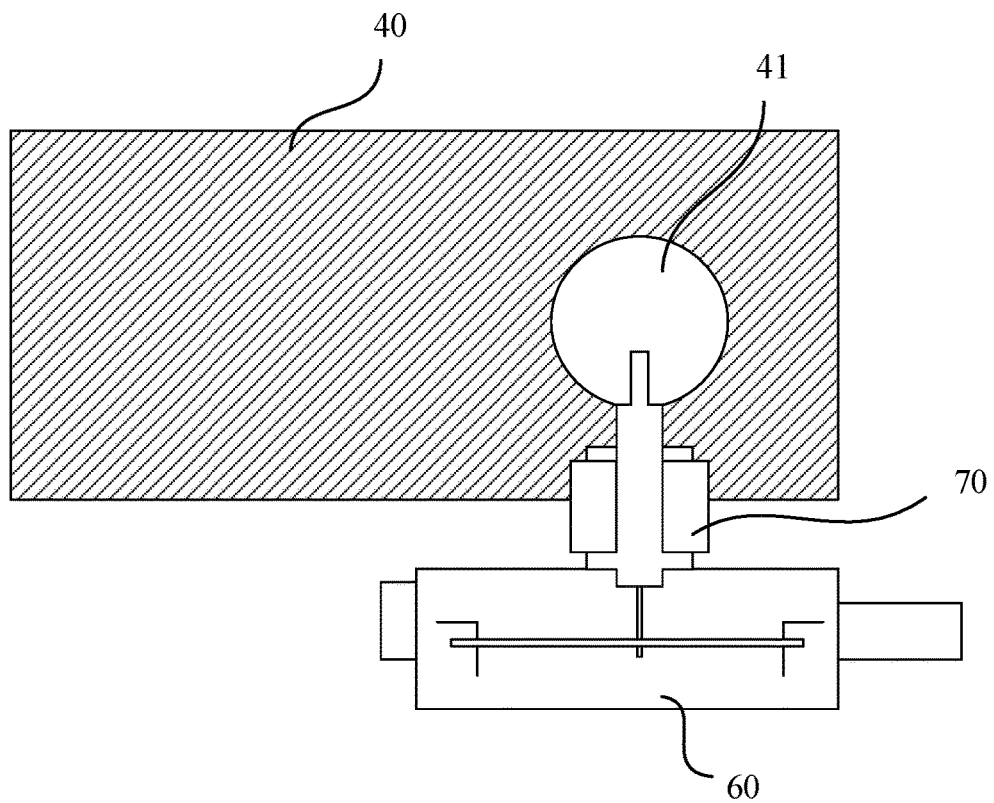
FIG. 1 is a structure diagram of an electric valve according to a first embodiment of the present application.
Figure 2:
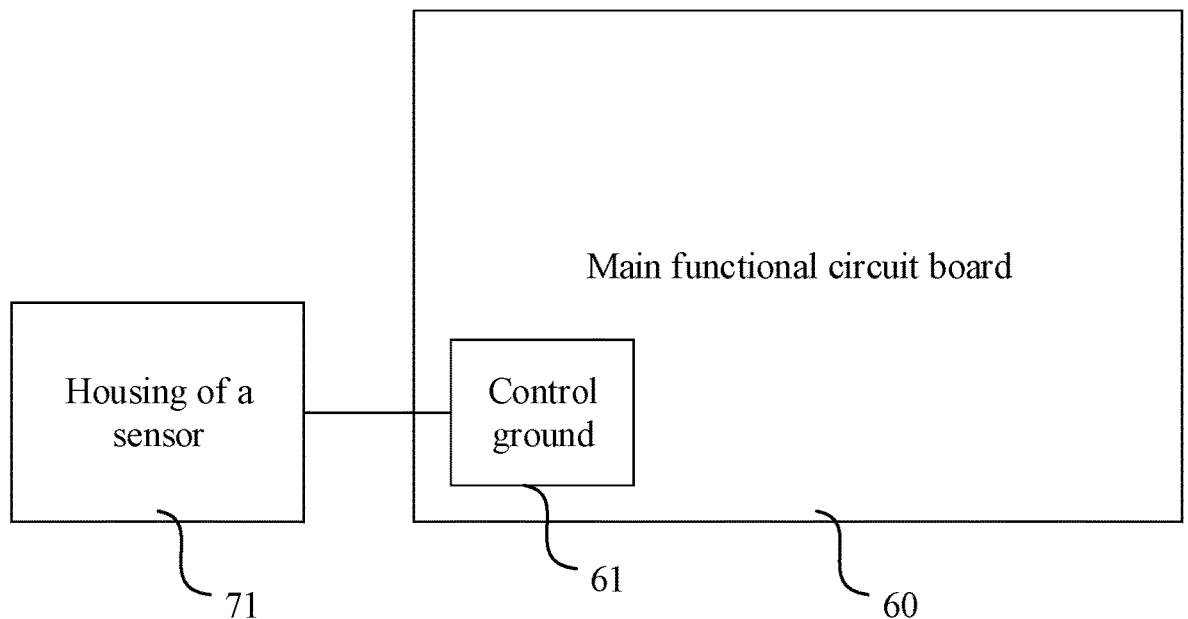
FIG. 2 is a schematic diagram of the electric valve of FIG. 1 in a first electrical connection mode.

An embodiment of the present application provides an electric valve. The electric valve may be, for example, an electronic expansion valve or a water valve. Referring to FIG. 1, FIG. 1 is a structure diagram of an electric valve according to a first embodiment of the present application. FIG. 2 is a schematic diagram of the electric valve of FIG. 1 in a first electrical connection mode. Referring to FIG. 1 and FIG. 2, FIG. 1 exemplarily shows that the electric valve is an electronic expansion valve, and the electric valve includes a valve body 40, a circuit board 60, and a sensor 70. The sensor 70 is connected to the circuit board 60 through at least one of electric connection and signal connection. The valve body 40 is formed with a passage 41, and the sensor 70 can detect a signal parameter, namely, at least one of a pressure and a temperature, of a working medium in the passage 41. At least one of the valve body 40 and a housing 71 of the sensor 70 includes a metal portion, and a reference ground 61 of the circuit board 60 is electrically connected directly or indirectly to the metal portion.

The sensor 70 may be, for example, a temperature sensor or a temperature-pressure (PT) sensor. The sensor 70 is arranged on the circuit board 60. Exemplarily, the sensor 70 is provided with a plurality of pins, the circuit board 60 is provided with a pad or a via hole electrically connected to the reference ground 61, and the sensor 70 is soldered on the circuit board 60 through the pins such that the sensor 70 and the circuit board 60 are connected in at least one of the electric connection mode and the signal connection mode. The circuit board 60 may include, for example, a power circuit, a sampling circuit, a control circuit, a drive circuit and the like so as to control the electric valve according to control information and information such as temperature information or pressure information of the sensor 70. For example, the circuit board 60 may supply a voltage to a motor connected to a spool of the electric valve so as to control the operation of the motor, thereby controlling the size of the valve port of the electric valve and further controlling a flow rate of a working medium in the passage 41. For example, the working medium may be coolant or refrigerant.

In one embodiment, at least one of the following may be included. The valve body 40 may be totally or partially made of metal. A housing 71 of the sensor 70 may be totally or partially made of metal. The metal portion is made of a metal material having good electrical conductivity, such as copper or aluminum, so as to enhance the shielding performance of the housing 71 of the sensor, thereby enhancing the electromagnetic compatibility performance of the electric valve.

The reference ground 61 of the circuit board 60 is directly or indirectly electrically connected to the metal portion of the housing 71 of the sensor, which is equivalent to the reference ground 61 being electrically connected to the ground, such that low-frequency radiation on the circuit board 60 is absorbed, thereby avoiding an electrostatic discharge effect generated by the circuit board 60 such that interference to external circuits is avoided, and therefore the problem of EMC low-frequency radiation is solved.

In the embodiments of the present application, the reference ground 61 of the circuit board 60 is directly or indirectly electrically connected to the metal portion, which is equivalent to the reference ground 61 being electrically connected to the ground, such that the low-frequency radiation on the circuit board 60 is released, thereby suppressing electromagnetic noise, reducing the interference of the circuit board 60 to the external circuits, and improving the problem of EMC low-frequency radiation. In this way, the circuit board 60 does not need to be additionally provided with an electromagnetic compatibility protection component, thus achieving the effect of improving the electromagnetic compatibility of the electric valve with less cost.

It is to be noted that in the above-mentioned embodiments, the reference ground 61 may be electrically connected to the housing 71 of the sensor in various modes, which is not limited in the present application. Several typical arrangement modes are described below.

Figure 3:
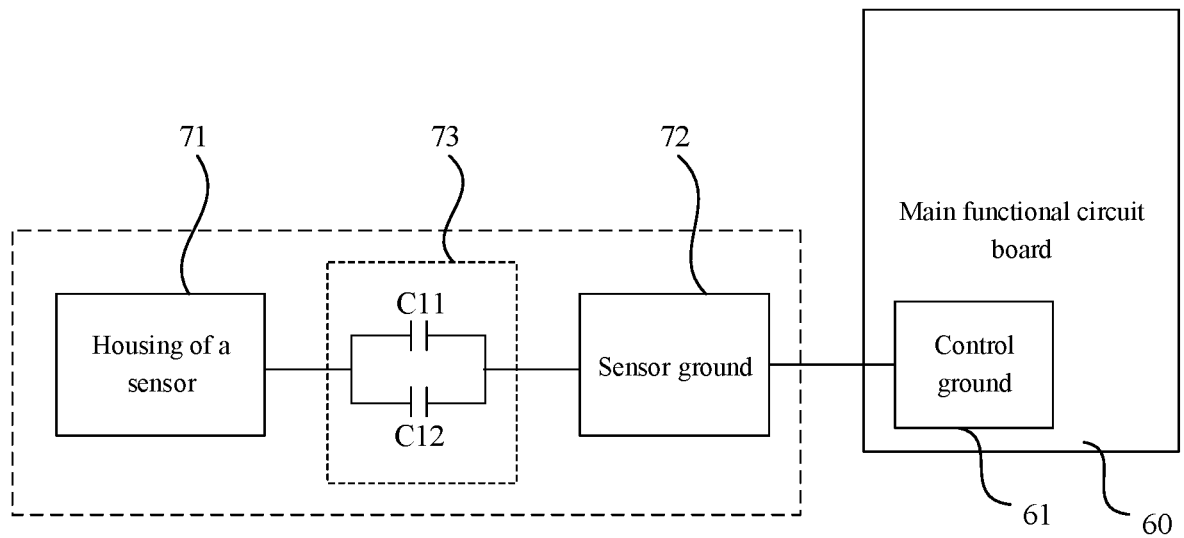
FIG. 3 is a schematic diagram of the electric valve of FIG. 1 in a second electrical connection mode.

FIG. 3 is a schematic diagram of the electric valve of FIG. 1 in a second electrical connection mode. Referring to FIG. 3, the sensor 70 includes a first electromagnetic compatibility adjustment unit 73 and a sensor ground 72, the sensor ground 72 is electrically connected to the metal portion of the housing 71 of the sensor 70 through the first electromagnetic compatibility adjustment unit 73, and the reference ground 61 of the circuit board 60 is electrically connected to the sensor ground 72 of the sensor 70. The sensor ground 72 described herein is a ground terminal of the sensor.

The first electromagnetic compatibility adjustment unit 73 may be, for example, a circuit unit of the sensor 70, and the first electromagnetic compatibility adjustment unit 73 can filter out signal harmonics of the sensor ground 72 so as to reduce the low-frequency radiation, thereby having an anti-interference effect and enhancing the electromagnetic compatibility performance of the sensor 70. In the embodiments of the present application, the reference ground 61 is electrically connected to the sensor ground 72, that is, the reference ground 61 is electrically connected to the metal portion of the housing 71 of the sensor 70 through the first electromagnetic compatibility adjustment unit 73 such that the first electromagnetic compatibility adjustment unit 73 of the sensor 70 is reused, thereby saving the cost of the electric valve.

Referring to FIG. 3, in the above-mentioned embodiments, the first electromagnetic compatibility adjustment unit 73 may further include at least one first capacitor, a first end of the at least one first capacitor is electrically connected to the sensor ground 72, and a second end of the at least one first capacitor is electrically connected to the metal portion of the housing 71 of the sensor 70. In this embodiment, the first electromagnetic compatibility adjustment unit 73 includes two first capacitors, namely, a first capacitor C11 and a first capacitor C12, separately.

When one first capacitor is provided, the sensor ground 72 is electrically connected to the metal portion of the housing 71 of the sensor 70 through the first capacitor. When at least two first capacitors are provided, the at least two first capacitors are connected in parallel, and the sensor ground 72 is electrically connected to the metal portion of the housing 71 of the sensor 70 through the at least two first capacitors connected in parallel. The first electromagnetic compatibility adjustment unit 73 is configured in such mode so that a purpose of reducing the low-frequency radiation is achieved.

Figure 4:
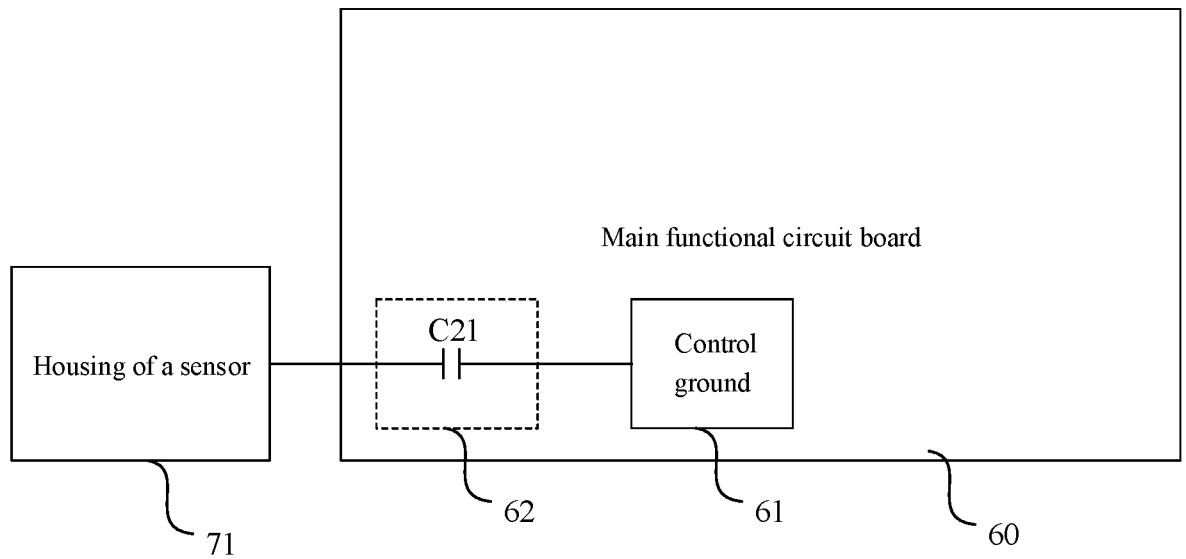
FIG. 4 is a schematic diagram of the electric valve of FIG. 1 in a third electrical connection mode.

FIG. 4 is a schematic diagram of the electric valve of FIG. 1 in a third electrical connection mode. Referring to FIG. 4, the circuit board 60 further includes a second electromagnetic compatibility adjustment unit 62, a first end of the second electromagnetic compatibility adjustment unit is electrically connected to the reference ground 61, and a second end of the second electromagnetic compatibility adjustment unit is electrically connected to the metal portion of the housing 71 of the sensor, that is, the reference ground 61 is electrically connected to the metal portion of the housing 71 of the sensor through the second electromagnetic compatibility adjustment unit 62. The second electromagnetic compatibility adjustment unit 62 can filter out signal harmonics of the reference ground 61 so as to reduce the low-frequency radiation, thereby having an anti-interference function and enhancing the electromagnetic compatibility performance of the circuit board 60, thereby further enhancing the electromagnetic compatibility performance of the electric valve.

It is to be noted that in the above-mentioned embodiments, the second electromagnetic compatibility adjustment unit 62 may be connected to the housing 71 of the sensor in various modes, which may be set as required in practical use.

In this embodiment, the circuit board 60 is provided with a first test portion electrically connected to the reference ground 61, the housing of the sensor 70 is provided with a second test portion, and the first test portion and the second test portion are electrically connected through a wire, a cable, or the like. Each test portion may be arranged in a welding mode.

Figure 5:
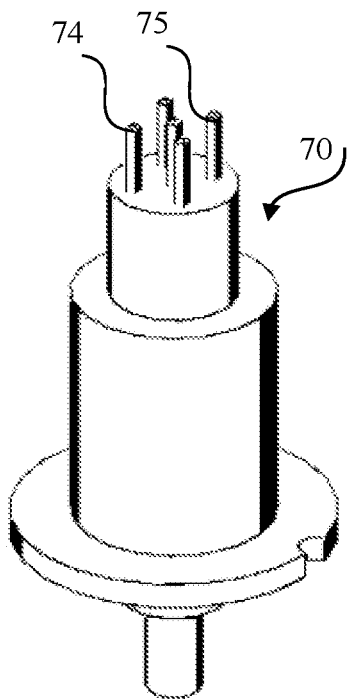
FIG. 5 is a structure diagram of a sensor of FIG. 1.
Figure 6:
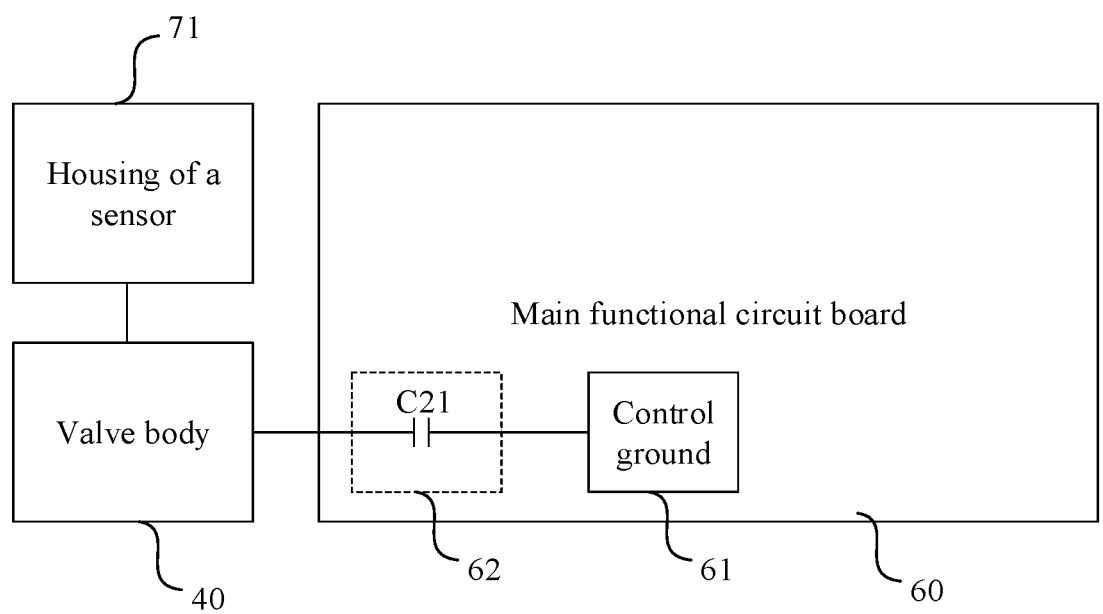
FIG. 6 is a schematic diagram of the electric valve of FIG. 1 in a fourth electrical connection mode.

FIG. 5 is a structure diagram of a sensor according to one embodiment of the present application. FIG. 6 is a schematic diagram of the electric valve of FIG. 1 in a fourth electrical connection mode. Referring to FIG. 5 and FIG. 6, in this embodiment, the sensor 70 includes a first pin 74 plugged into one end of the sensor 70, one end of the first pin 74 is electrically connected to the metal portion of the housing 71 of the sensor, and the other end of the first pin 74 is electrically connected to the reference ground 61 of the circuit board.

The circuit board 60 may be provided with an electrical connection portion, such as a pad, a plug-in hole or a test portion, electrically connected to the reference ground 61, and the other end of the first pin 74 of the sensor 70 may be connected to the electrical connection portion by soldering or the like. The first pin 74 disposed on the sensor 70 and electrically connected to the metal portion of the housing 71 is equivalent to a redesign of the sensor 70, and in the redesign, the pin electrically connected to the metal portion of the housing 71 of the sensor is added. Such configuration of the sensor 70 facilitates the electrical connection between the metal portion of the housing 71 of the sensor and the reference ground 61 of the circuit board 60.

In the above-mentioned embodiments, the sensor 70 further includes four second pins 75, and the four second pins 75 are a power pin, a P-type pin, a T-type pin and a GND pin, respectively. Correspondingly, the circuit board 60 is further provided with plug-in holes that can be plugged with the four second pins 75 and a control circuit, and the control circuit is electrically connected to the plug-in holes such that data of the sensor 70 plugged into the circuit board 60 through the four second pins 75 can be transmitted to the control circuit. Such configuration of the sensor 70 and the circuit board 60 further facilitate the connection between the sensor 70 and the circuit board 60.

FIG. 6 is a schematic diagram of the electric valve of FIG. 1 in a fourth electrical connection mode. Referring to FIG. 6, on the basis of the above-mentioned embodiments, the circuit board 60 further includes the second electromagnetic compatibility adjustment unit 62. The housing 71 of the sensor is fixedly connected to the valve body 40, a first end of the second electromagnetic compatibility adjustment unit 62 is electrically connected to the reference ground 61, and a second end of the second electromagnetic compatibility adjustment unit 62 is electrically connected to the valve body 40. In conjunction with FIG. 1, the housing 71 of the sensor is fixedly connected to the valve body 40. In an embodiment, the sensor 70 may be secured near a passage 41 of the valve body 40, and the working medium flows in the passage 41. The first end of the second electromagnetic compatibility adjustment unit 62 is electrically connected to the reference ground 61. In another embodiment, the circuit board 60 is provided with a first test portion electrically connected to the second electromagnetic compatibility adjustment unit 62, the valve body 40 is provided with a second test portion, and the first test portion and the second test portion are connected by a wire or a pin. With such configuration of the sensor 70, on one aspect, a temperature and a pressure of the working medium in the valve body 40 can be detected; and on the other hand, the reference ground 61 of the circuit board 60 is electrically connected to the metal portion of the housing 71 of the sensor through the valve body 40. The valve body 40 is electrically connected to the metal portion of the housing 71 of the sensor such that a grounding area is increased, thereby further enhancing the electromagnetic compatibility performance of the electric valve.

In the above-mentioned embodiment, the valve body 40 is made of a metal material having better electrical conductivity, such as copper or aluminum, so as to enhance shielding performance of the valve body 40.

Referring to FIG. 4 and FIG. 6, in the above-mentioned embodiments, the second electromagnetic compatibility adjustment unit 62 includes at least one second capacitor C21, a first end of the at least one second capacitor C21 is electrically connected to the first end of the second electromagnetic compatibility adjustment unit 62, and a second end of the at least one second capacitor C21 is electrically connected to the second end of the second electromagnetic compatibility adjustment unit 62.

When one second capacitor C21 is provided, the valve body 40 is electrically connected to the reference ground 61 of the circuit board through the second capacitor C21. When at least two second capacitors C21 are provided, the at least two second capacitors C21 are connected in parallel, and the valve body 40 is electrically connected to the reference ground 61 of the circuit board through the at least two second capacitors C21 connected in parallel. The second electromagnetic compatibility adjustment unit 62 is configured in such mode so that the function of reducing the low-frequency radiation is achieved. In the embodiments for FIG. 4 and FIG. 6, the second electromagnetic compatibility adjustment unit 62 includes one second capacitor.

In the above-mentioned embodiments, a capacitance value of the second electromagnetic compatibility adjustment unit 62 is between 1 nF and 10 nF. If the second electromagnetic compatibility adjustment unit 62 includes one second capacitor, the capacitance value of the second capacitor is between 1 nF and 10 nF. If the second electromagnetic compatibility adjustment unit 62 includes at least two second capacitors connected in parallel, the capacitance value of the at least two second capacitors connected in parallel is between 1 nF and 10 nF. Such configuration of the second electromagnetic compatibility adjustment unit 62 enhances the effect of filtering the low-frequency radiation.

Figure 7:
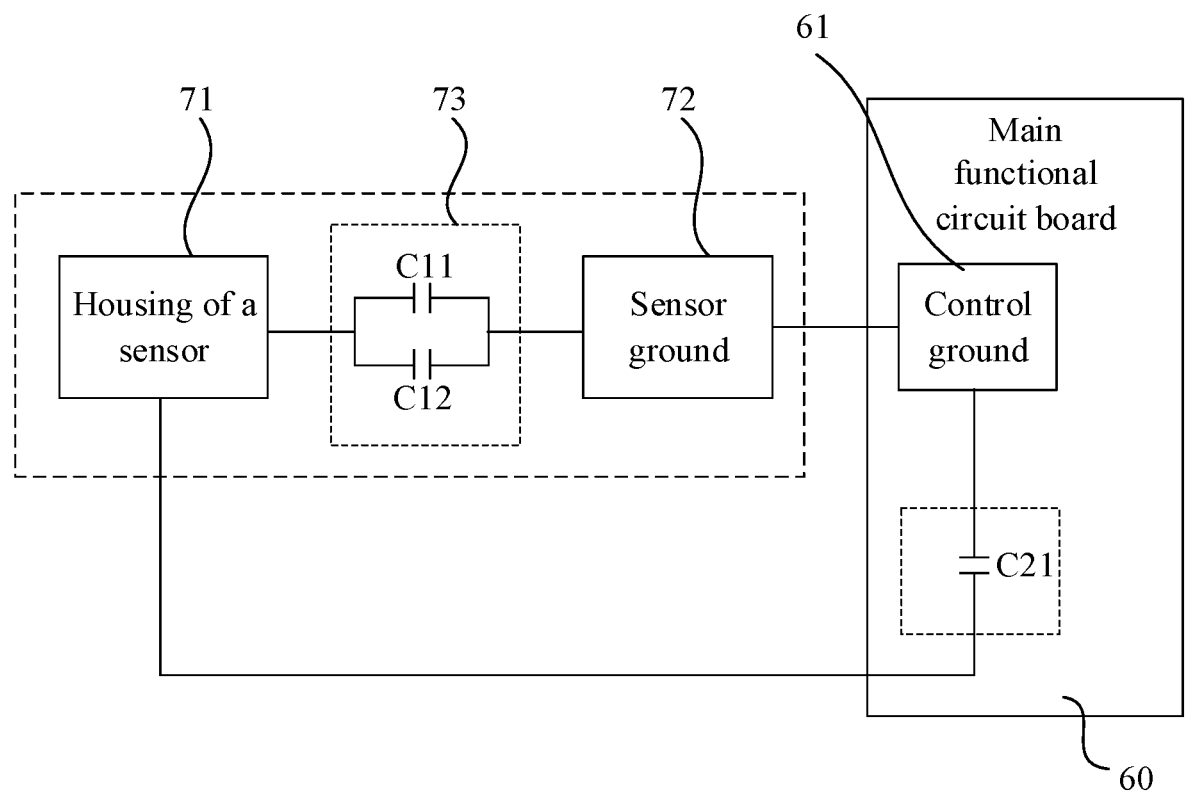
FIG. 7 is a schematic diagram of the electric valve of FIG. 1 in a fifth electrical connection mode.

FIG. 7 is a schematic diagram of the electric valve of FIG. 1 in a fifth electrical connection mode. Referring to FIG. 7, on the basis of the above-mentioned embodiments, the electric valve includes two electromagnetic compatibility circuits, and one of the two electromagnetic compatibility circuits is described below. The sensor ground 72 is electrically connected to the reference ground 61, and the sensor ground 72 is electrically connected to the housing 71 of the sensor through the first electromagnetic compatibility adjustment unit 73. The other one of the two electromagnetic compatibility circuits is described below. The reference ground 61 is electrically connected to the housing 71 of the sensor through the second electromagnetic compatibility adjustment unit 62. Such configuration of the electric valve further reduces the low-frequency radiation of the circuit board 60 and enhances the electromagnetic compatibility performance of the electric valve.

Figure 8:
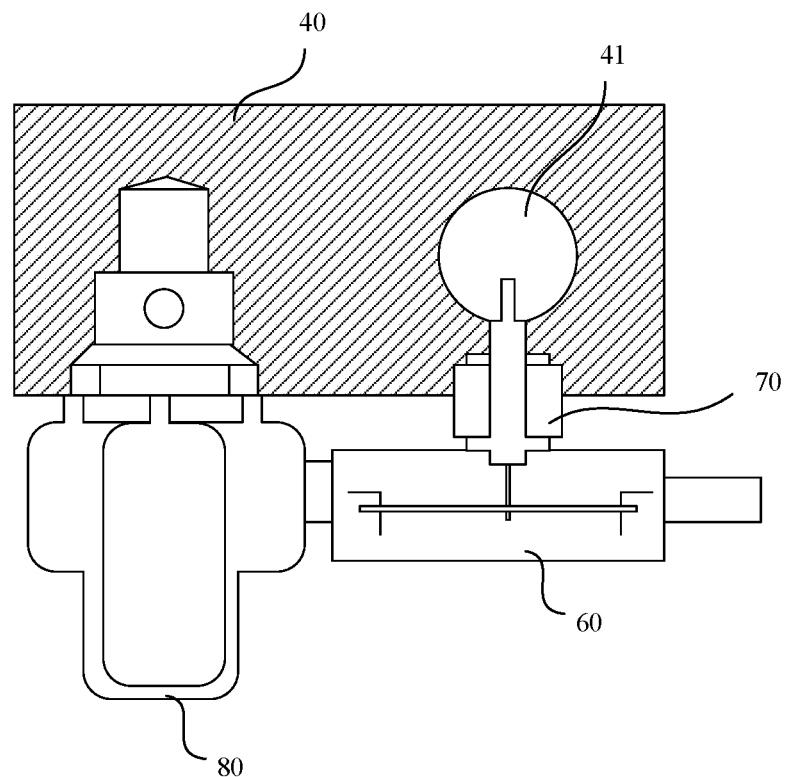
FIG. 8 is a structure diagram of an electric valve according to a second embodiment of the present application.
Figure 9:
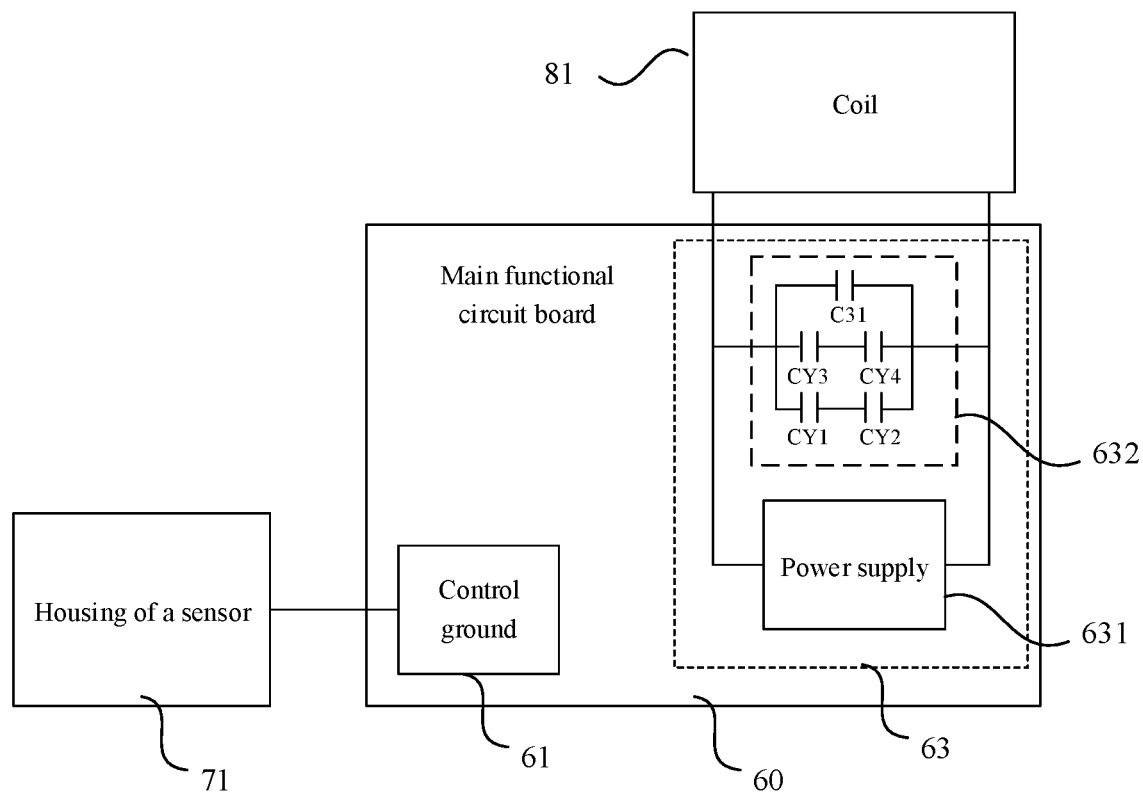
FIG. 9 is a schematic diagram of the electric valve of FIG. 8 in an electrical connection mode.
Figure 10:
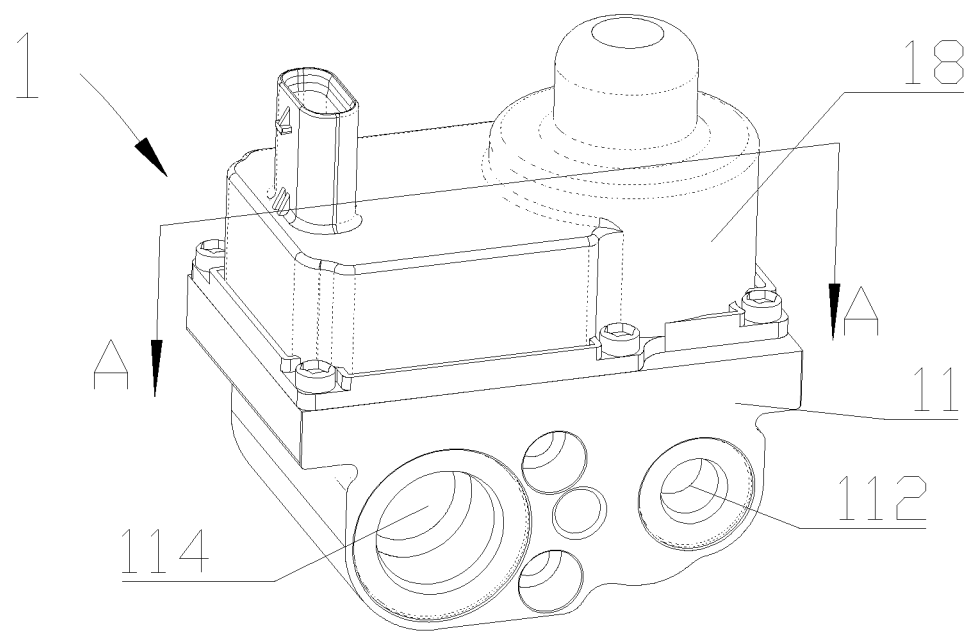
FIG. 10 is a perspective view of an electric valve in one direction according to a third embodiment of the present application.
Figure 11:
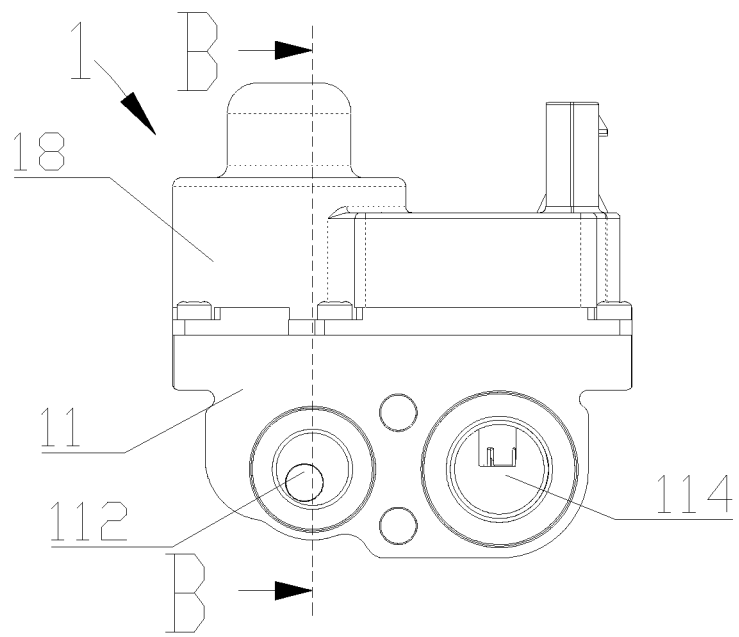
FIG. 11 is a front view of the electric valve of FIG. 10.
Figure 12:
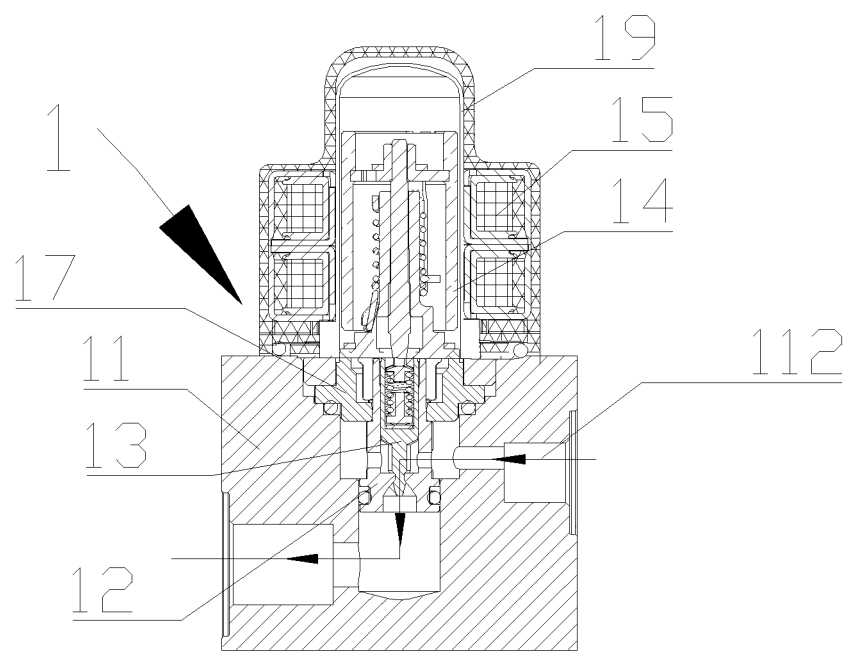
FIG. 12 is a cross-sectional view of the electric valve of FIG. 11 taken along a line B-B.
Figure 13:
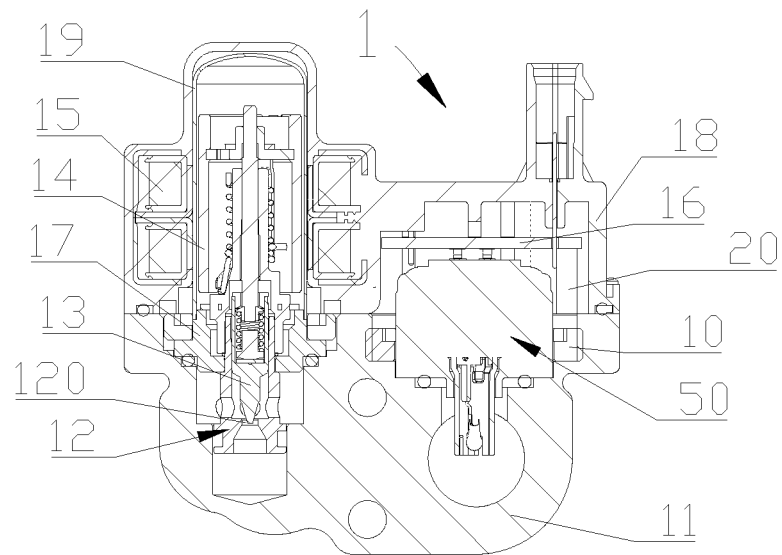
FIG. 13 is a cross-sectional view of the electric valve of FIG. 10 taken along a line A-A.
Figure 14:
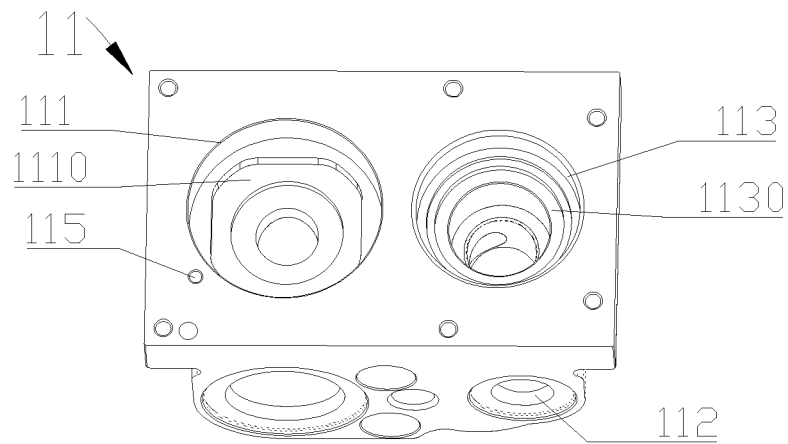
FIG. 14 is a perspective view of a valve body of FIG. 10 to FIG. 13 in one direction.
Figure 15:
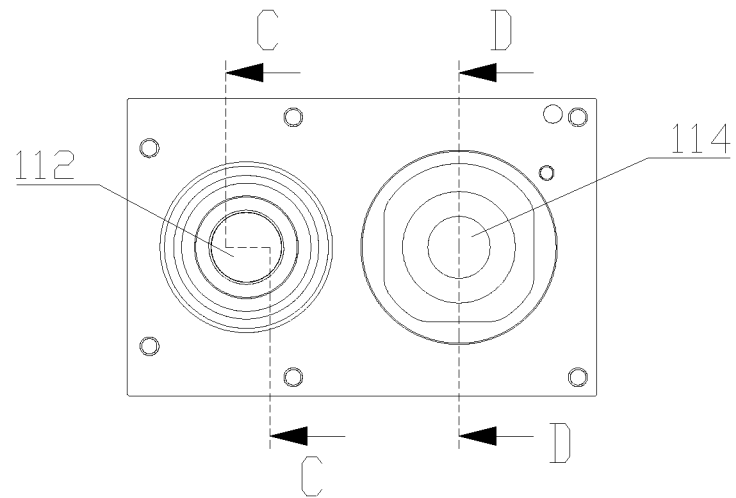
FIG. 15 is a front view of the valve body of FIG. 14 in one direction.
Figure 16:
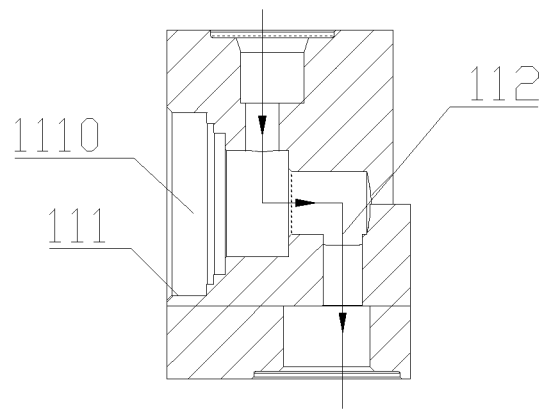
FIG. 16 is a cross-sectional view of the electric valve of FIG. 15 taken along a line C-C.
Figure 17:
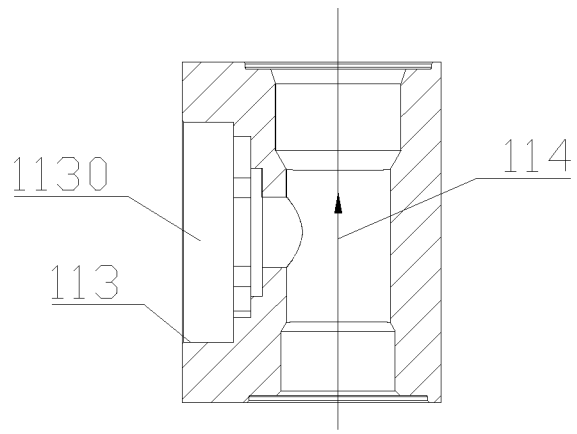
FIG. 17 is a cross-sectional view of the electric valve of FIG. 15 taken along a line D-D.

FIG. 8 is a structure diagram of an electric valve according to a second embodiment of the present application. FIG. 9 is a schematic diagram of the electric valve of FIG. 8 in an electrical connection mode. Referring to FIG. 8 and FIG. 9, on the basis of the above-mentioned embodiments, the electric valve further includes a motor 80 mechanically connected to the valve body 40, and the motor 80 includes a coil 81. The circuit board 60 further includes a power circuit 63, the power circuit 63 supplies power to the coil 81, a positive electrode of the power circuit 63 is electrically connected to a first end of the coil 81, and a negative electrode of the power circuit 63 is electrically connected to a second end of the coil 81. The power circuit 63 includes a third electromagnetic compatibility adjustment unit 632, and the third electromagnetic compatibility adjustment unit 632 is connected to the coil 81 in parallel.

The motor 80 may be, for example, a stepping motor. The stepping motor adopts an open-loop control mode in which an electric pulse signal is converted into an angular displacement or a linear displacement, and this control mode is relatively simple. The stepping motor is used to control the valve body 40 such that an effect of accurately controlling the position of the valve body 40 may be achieved. The third electromagnetic compatibility adjustment unit 632 may be disposed, for example, at a position near the coil 81, thereby filtering out high-frequency radiation interference generated by the coil 81, and further enhancing the electromagnetic compatibility performance of the electric valve.

Referring to FIG. 9, the power circuit 63 further includes a power supply 631, the power supply 631 may be, for example, a battery or a regulated power supply, and the power supply 631 is connected in parallel to two ends of the coil 81 so as to supply power to the coil 81.

Referring to FIG. 9, in the above-mentioned embodiments, the third electromagnetic compatibility adjustment unit 632 includes a fourth capacitor C31, a fifth capacitor CY1, a sixth capacitor CY2, a seventh capacitor CY3, and an eighth capacitor CY4. A first end of the fourth capacitor C31 is electrically connected to a first end of the third electromagnetic compatibility adjustment unit 632, and a second end of the fourth capacitor C31 is electrically connected to a second end of the third electromagnetic compatibility adjustment unit 632. The fifth capacitor CY1 and the sixth capacitor CY2 are connected in series between the first end and the second end of the third electromagnetic compatibility adjustment unit 632. The seventh capacitor CY3 and the eighth capacitor CY4 are connected in series between the first end and the second end of the third electromagnetic compatibility adjustment unit 632.

The fourth capacitor C31 is connected in parallel at two ends of the coil 81, and a capacitance value of the fourth capacitor C31 may be, for example, between 100 uF and 200 uF. Capacitance values of the fifth capacitor CY1, the sixth capacitor CY2, the seventh capacitor CY3, and the eighth capacitor CY4 are respectively less than 47 nF. The fifth capacitor CY1 and the sixth capacitor CY2 are connected in series and then connected in parallel at two ends of the coil 81, and the seventh capacitor CY3 and the eighth capacitor CY4 are connected in series and then connected in parallel at two ends of the coil 81, thereby forming two Y-type capacitors at two ends of the coil 81. Such configuration of the third electromagnetic compatibility adjustment unit 632 facilitates the filtering of the high-frequency radiation interference generated by the coil 81.

Referring to FIG. 10 to FIG. 13, FIG. 10 to FIG. 13 are structure diagrams of an electric valve according to a third embodiment of the present application. The structure of the electric valve according to the third embodiment is described in detail below.

Referring to FIG. 10 to FIG. 13, the electric valve 1 includes a valve body 11, a valve seat 12, a spool 13, a rotor assembly 14, a stator assembly 15, and a circuit board 16. The valve seat 12 is provided with a valve port 120, the stator assembly 15 is disposed on an outer periphery of the rotor assembly 14, and the stator assembly 15 is connected to the circuit board 16 in at least one of an electric connection mode and a signal connection mode. In this embodiment, a sleeve 19 is disposed between the stator assembly 15 and the rotor assembly 14 so as to isolate the stator assembly 15 and the rotor assembly 14. When the electric valve 1 operates, a current of a winding of the stator assembly 15 is controlled to change according to a predetermined rule such that the stator assembly 15 is controlled to generate a variable excitation magnetic field, the rotor assembly 14 rotates under the action of the excitation magnetic field, and the rotor assembly 14 is connected to the spool 13 such that the spool 13 can be driven to move up and down relative to the valve seat 12, thereby adjusting an opening degree of the valve port 120.

Referring to FIG. 10 to FIG. 16, the valve body 11 includes a first mounting portion 111 and a first flow passage 112. The first flow passage 112 is capable of allowing a working medium flowing therethrough, the first mounting portion 111 has a first cavity 1110, and the first cavity 1110 is communicated with the first flow passage 112. In conjunction with FIG. 4 and FIG. 5, at least a part of the valve port 120 is located in the first cavity 1110. In this embodiment, the first flow passage 112 is composed of flow passages of different calibers, and of course, the first flow passage 112 may also be composed of flow passages of the same caliber. Referring to FIG. 4 and FIG. 5, the electric valve 1 further includes a fixing member 17, the fixing member 17 is sleeved on an outer side of the valve seat 12 and is fixedly connected to the valve seat 12, the sleeve 19 is sleeved on the outer periphery of the rotor assembly 14, the sleeve 19 is fixed to the fixing member 17 by welding, that is, the sleeve 19 is connected to the valve seat 12 through the fixing member 17, which facilitates simplification of a mold, miniaturizes the mold, and facilitates forming of the valve seat 12. Of course, the fixing member 17 may also be integrally formed with the valve seat 12, such that the connection between the fixing member 17 and the valve seat 12 does not need to be configured. In this embodiment, the valve port 120 communicates with the first flow passage 112 located on two sides of the valve port 120, and the spool 13 changes a flow cross-sectional area of the first flow passage 112 at the valve port 120 by moving towards and away from the valve port 120, thereby forming throttling at the valve port 120.

Referring to FIG. 10 to FIG. 16, the valve body 11 further includes a second mounting portion 113 and a second flow passage 114. The second mounting portion 113 has a second cavity 1130, and the second cavity 1130 is communicated with the second flow passage 114. The electric valve 1 further includes a sensor 50, at least a part of the sensor 50 is located in the second cavity 1130, and the sensor 50 is connected to the circuit board 16 in at least one of an electric connection mode and a signal connection mode. In the present application, the electric valve 1 can detect parameters, such as the temperature and the pressure of the working medium, in a system through the sensor 50, the above-mentioned parameters are fed back to the circuit board 16, and then the circuit board 16 adjusts the opening degree of the electric valve 1 according to a corresponding control program. In this embodiment, the sensor 50 is fixedly connected to and positioned with the valve body 11, and a detection end of the sensor 50 abuts against the circuit board 16, thereby facilitating the relative reduction of circuit arrangement, and further facilitating the simplification of the assembly of the sensor and the circuit board in the electric valve.

Figure 18:
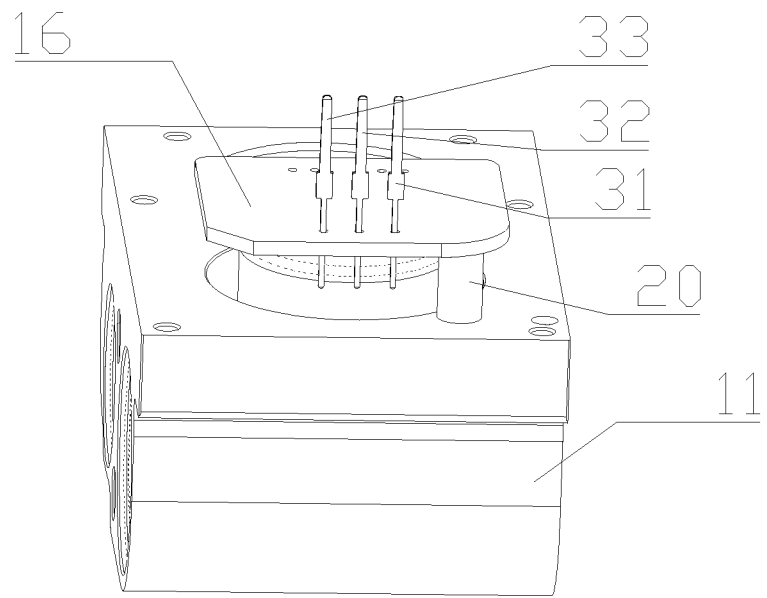
FIG. 18 is a perspective view of a valve body, a circuit board, a first pin, a second pin, a third pin, and a conductive member of FIG. 13 being combined according to a first embodiment of the present application.

Referring to FIG. 18, the electric valve 1 further includes a first pin 31, a second pin 32, and a third pin 33. The first pin 31 is a ground end of the circuit board 16, the second pin 32 is a power end of the circuit board 16, and the third pin 33 is a communication end of the circuit board 16. The first pin 31, the second pin 32, and the third pin 33 are fixedly connected to the circuit board 16. In the present application, the electric valve 1 further includes a conductive member 20. The conductive member 20 and the valve body 11 are electroconductive, at least a part of the conductive member 20 is arranged between the circuit board 16 and the valve body 11, and at least a part of the conductive member 20 is arranged to be in contact with the circuit board 16. The contact arrangement may be that the conductive member 20 is in contact with the circuit board 16 by a fixed connection, or the conductive member 20 and the circuit board 16 are in direct contact instead of a fixed connection. The reference ground of the circuit board 16 and the valve body 11 may be electroconductive through the conductive member 20. In this way, it is beneficial to lead out static electricity from the valve body 11, thus reducing the influence of the static electricity on the electric valve 1, and further improving the electromagnetic compatibility of the electric valve 1. The reference ground of the circuit board 16 in the present application may be the copper coating of the circuit board 16.

The structure of the conductive member 20 according to six embodiments is described below. For the convenience of describing the conductive member of the six embodiments, the conductive member of the first embodiment is labeled as the conductive member 20, and other reference numbers are not suffixed; the conductive member of the second embodiment is labeled as the conductive member 20a, and other reference numbers are suffixed with a; the conductive member of the third embodiment is labeled as the conductive member 20b, and other reference numbers are suffixed with b; the conductive member of the fourth embodiment is labeled as the conductive member 20c, and other reference numbers are suffixed with c; the conductive member of the fifth embodiment is labeled as the conductive member 20d, and other reference numbers are suffixed with d; and the conductive member of the sixth embodiments is labeled as the conductive member 20e, and other reference numbers are suffixed with e.

Figure 19:
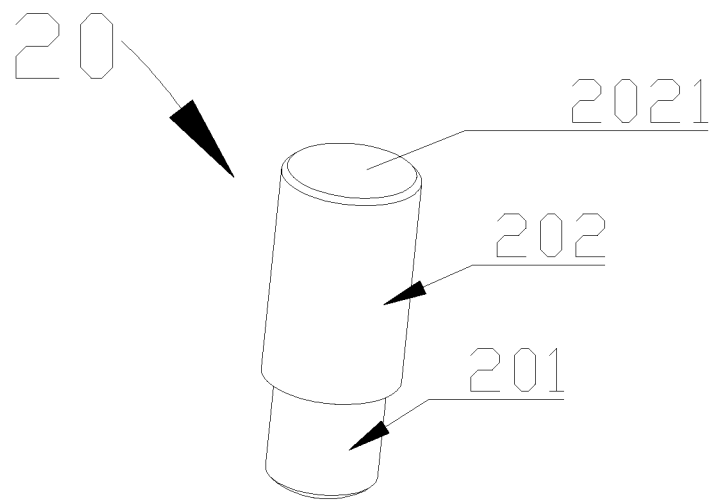
FIG. 19 is a perspective view of the conductive member of FIG. 18.
Figure 20:
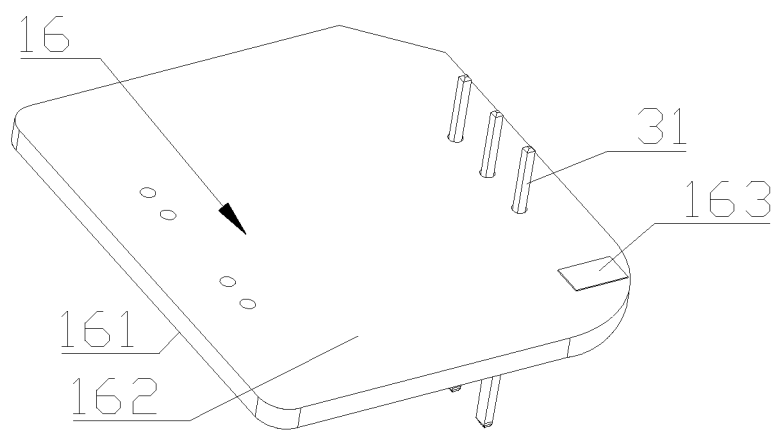
FIG. 20 is a perspective view of the circuit board, the first pin, the second pin, and the third pin of FIG. 18 being combined.

Referring to FIG. 18 to FIG. 20, FIG. 18 is a structure diagram of a valve body 11, a circuit board 16, and a conductive member 20 being combined according to a first embodiment of the present application; FIG. 19 is a structure diagram of the conductive member of FIG. 18; and FIG. 20 is a structure diagram of a conductive member 20, a first pin 31, a second pin 32, and a third pin 33 being combined. The structure of the conductive member 20 of the first embodiment is described in detail below.

Referring to FIG. 18 to FIG. 20, in this embodiment, the conductive member 20 is fixedly connected to the valve body 11. In an embodiment, in conjunction with FIG. 14, the valve body 11 is provided with connecting hole 115, the connecting hole 115 extends from an upper surface of the valve body 11 in a direction facing away from the upper surface of the valve body 11. The conductive member 20 includes a fitting portion 201 and an upper portion 202, the upper portion 202 is integrally formed with the fitting portion 201, the fitting portion 201 is tightly fitted with and connected to the connecting hole 115 of the valve body, and an upper surface 2021 of the upper portion 202 abuts against the circuit board 16. In this embodiment, the fitting portion 201 and the connecting hole 115 are tightly fitted with and connected through interference fitting or transition fitting between the fitting portion 201 and the connecting hole 115.

Of course, the fitting portion 201 may also be threadedly connected to the connecting hole 115 of the valve body. The fitting portion 201 is formed with external threads and the connecting hole 115 is formed with internal threads, and the external threads and the internal threads are fitted to each other to achieve a fixed connection. When the conductive member 20 is threadedly connected to the valve body 11, the conductive member 20 may be a bolt or a screw, which is beneficial to saving the manufacturing cost. In addition, the conductive member 20 and the valve body 11 are made of conductive metal materials. When the valve body 11 is made of aluminum, a surface of the aluminum may be treated by a surface anodic oxidation process in order to protect the surface of the aluminum from corrosion. The electrical conductivity of the aluminum will decrease after the surface of the aluminum is anodized, while the tight fitting between the fitting portion 201 and the connecting hole 115 is further advantageous to enable the fitting portion 201 of the conductive member 20 to scrape off an anodic oxide layer on an inner circumferential surface of the connecting hole 115, thereby facilitating the improvement of the electrical conductivity of the valve body 11. Of course, the surface treatment of the valve body 11 may also be performed by a process such as chrome plating, and the electrical conductivity of the valve body 11 will not be affected by the coating at this time.

Referring to FIG. 20, the circuit board 16 includes a first surface 161 and a second surface 162, and the first surface 161 faces away from the valve body 11. In conjunction with FIG. 18, the second surface 162 faces toward the valve body 11, the first surface 161 is disposed in parallel and opposite to the second surface 162, and a depth of parallelism within a range of machining errors is within the protection scope of the present application. Referring to FIG. 20, the circuit board 16 further includes an abutment portion 163, and the abutment portion 163 is arranged on the second surface 162 and electrically connected to the reference ground of the circuit board 16.

In conjunction with FIG. 19 and FIG. 20, in this embodiment, the upper surface 2021 of the upper portion 202 is in contact with the abutment portion 163 and electrically connected to the abutment portion 163. In this way, the conductive member 20 and the reference ground 31 of the circuit board 16 are indirectly electroconductive through the abutment portion 163. In addition, in this embodiment, the surface of the abutment portion 163 is provided with a conductive layer, where the conductive layer may be treated by tin plating, chemical nickel plating, gold leaching and the like, thereby facilitating improvement of the electrical conductivity between the abutment portion 163 and the conductive member 20. Of course, the abutment portion 163 may also be processed into a separate component and then fixedly connected to the circuit board 16. At this time, the abutment portion 163 may be other conductive structures such as a conductive metal sheet.

Figure 21:
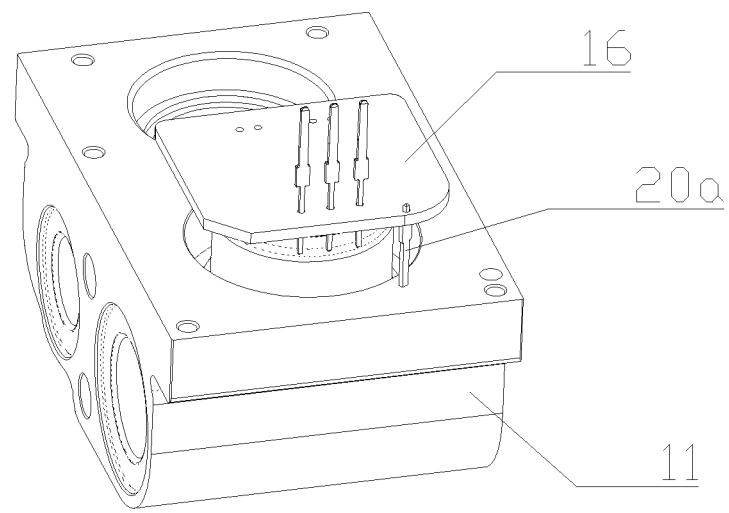
FIG. 21 is a perspective view of a valve body, a circuit board, a first pin, a second pin, a third pin, and a conductive member of FIG. 13 being combined according to a second embodiment of the present application.
Figure 22:
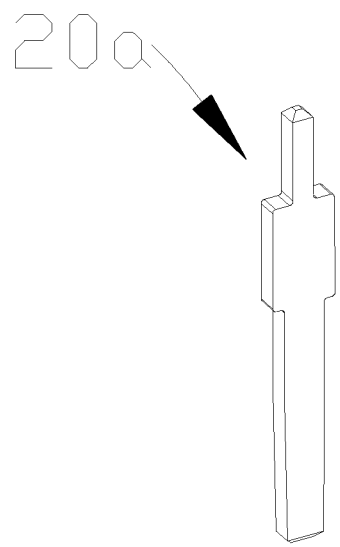
FIG. 22 is a perspective view of the conductive member of FIG. 21.
Figure 23:
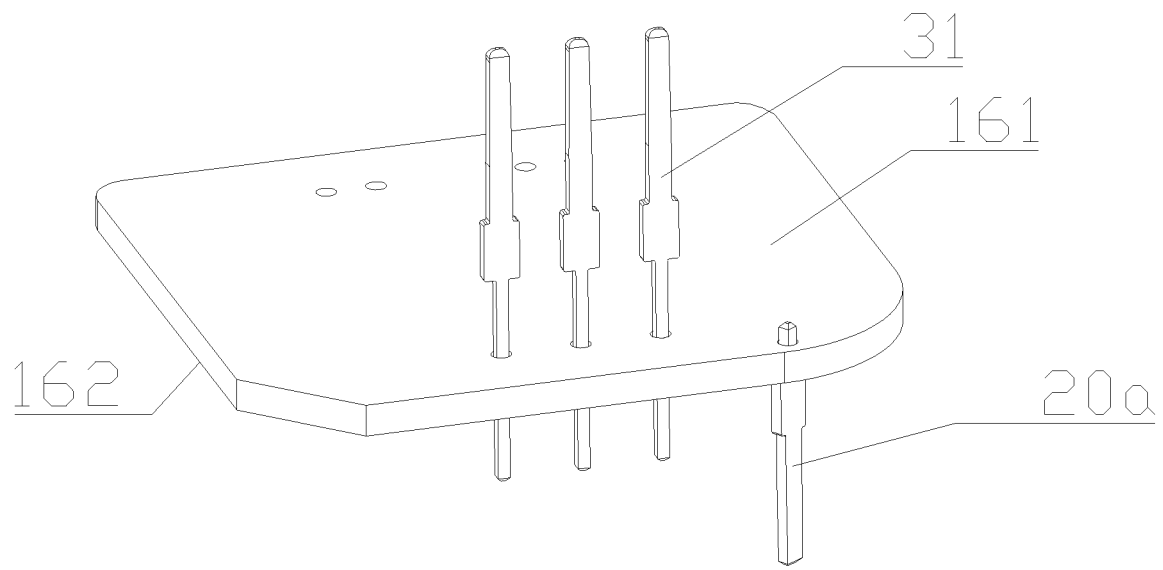
FIG. 23 is a perspective view of the circuit board, the first pin, the second pin, the third pin, and the conductive member of FIG. 21 being combined.

Referring to FIG. 21 to FIG. 23, FIG. 21 is a structure diagram of a valve body 11, a circuit board 16, a conductive member 20a being combined according to a second embodiment; FIG. 22 is a structure diagram of the conductive member of FIG. 21; and FIG. 23 is a structure diagram of the conductive member 20a, the first pin 31, the second pin 32 and the third pin 33 being combined. The structure of the conductive member 20a of the second embodiment is described in detail below.

Referring to FIG. 21 to FIG. 23, in this embodiment, the conductive member 20a is electrically connected to the reference ground of the circuit board 16, and one end of the conductive member 20a is fixedly connected to the circuit board 16. In an embodiment, the conductive member 20a passes through the first surface 161 and the second surface 162 of the circuit board 16 and is fixedly connected to the circuit board 16 by soldering. Of course, the conductive member 20a may only pass through the second surface 162 of the circuit board 16 and not pass through the first surface 161 of the circuit board 16. The other end of the conductive member 20a is in contact with the valve body 11, and the contact arrangement may be that the conductive member 20a is in contact with the valve body 11 through the fixed connection, or that the conductive member 20a is not fixedly connected to the valve body 11 but the conductive member 20a is in direct contact with the valve body 11. In this embodiment, the structure of the conductive member 20a is similar to the structure of the first pin 31, and of course, the conductive member 20a may also be designed in other structures so as to achieve the electric conductive function.

In this embodiment, when the valve body 11 is made of aluminum, if the surface of the valve body 11 is treated by the anodic oxidation process, a surface coating of the valve body corresponding to a contact position between the conductive member 20a and the valve body 11 may be scraped off before the assembly to improve the electrical conductivity of the valve body. Of course, if the surface of the valve body 11 is treated by chrome plating or the like, a surface of the valve body corresponding to the contact position between the conductive member and the valve body does not need to be additionally scraped off. Other features in this embodiment are similar to that in the first embodiment and will not be repeated herein.

Figure 24:
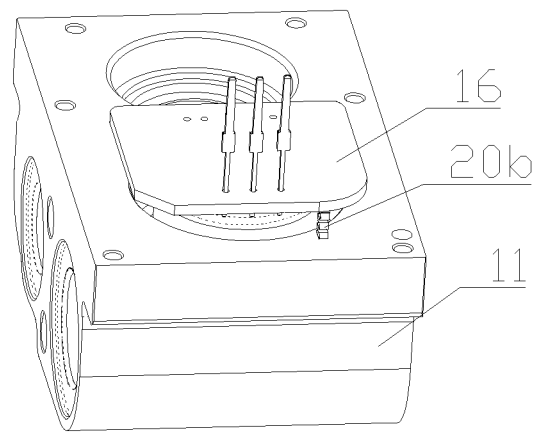
FIG. 24 is a perspective view of a valve body, a circuit board, a first pin, a second pin, a third pin, and a conductive member of FIG. 13 being combined according to a third embodiment of the present application.
Figure 25:
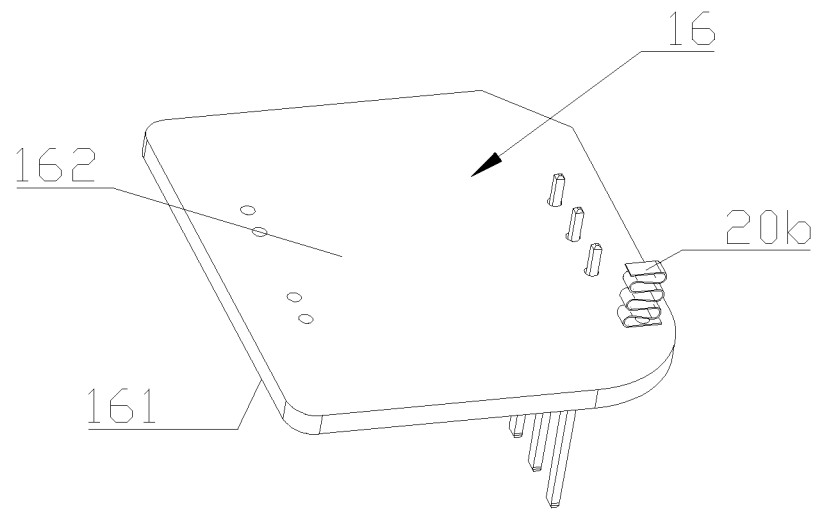
FIG. 25 is a perspective view of the circuit board, the first pin, the second pin, the third pin, and the conductive member of FIG. 24 being combined.
Figure 26:
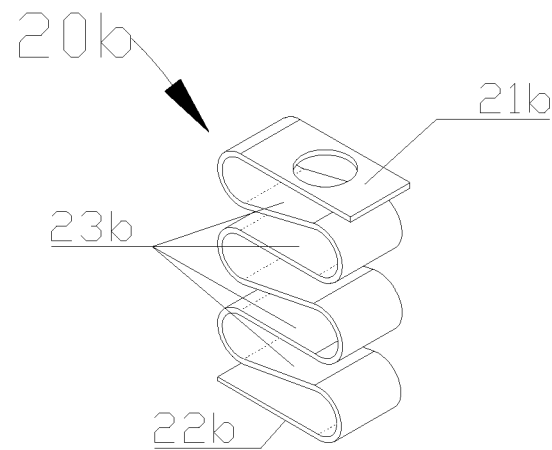
FIG. 26 is a perspective view of the conductive member of FIG. 24 or FIG. 25.

Referring to FIG. 24 to FIG. 26, FIG. 24 is a structure diagram of a valve body 11, a circuit board 16, and a conductive member 20b being combined according to a third embodiment of the present application; FIG. 25 is a structure diagram of a conductive member 20b, a first pin 31, a second pin 32, and a third pin 33 being combined; and FIG. 26 is a structure diagram of the conductive member 20b of FIG. 24 and FIG. 25. The structure of the conductive member 20b of the third embodiment is described in detail below.

Referring to FIG. 24 to FIG. 26, in this embodiment, the conductive member 20b is fixedly connected to the circuit board 16, and the circuit board 16 includes a first surface 161 and a second surface 162. The first surface 161 faces away from the valve body 11, the second surface 162 faces towards the valve body 11, and the first surface 161 is disposed in parallel and opposite to the second surface 162. In this embodiment, the conductive member 20b is an elastic element, the conductive member 20b includes a first connecting end 21b and a second connecting end 22b, the first connecting end 21b is fixedly connected to the second surface 162 of the circuit board 16 by welding, and the second connecting end 22b is in contact with the valve body 11. In this way, the conductive member 20b is fixedly connected to the circuit board 16 in a surface-mount mode, thereby facilitating the simplification of the assembly process of the conductive member 20b.

Referring to FIG. 26, the conductive member 20b further includes middle portions 23b having a plate shape, the middle portions 23b are arranged between the first connecting end 21b and the second connecting end 22b, and adjacent middle portions 23b are smoothly and transitionally connected end to end through a circular arc. In this way, on the one hand, it is advantageous to avoid stress concentration; and on the other hand, the conductive member 20b is prone to elastic deformation. In addition, the elastic element in this embodiment may also be a spring, a leaf spring, or other elastic elements.

Referring to FIG. 24 to FIG. 26, after the conductive member 20b is mounted, the first connecting end 21b of the conductive member 20b is fixedly connected to the circuit board 16, the second connecting end 22b of the conductive member 20b is directly abutted against the valve body 11. Since the conductive member 20b is an elastic element, the conductive member 20b is compressed and deformed under the force of the circuit board 16, and thus the conductive member 20b is elastically deformed; in other words, a length of the conductive member 20b between the circuit board 16 and the valve body 11 is less than a length of the conductive member 20b in a natural state. Generally, in an assembly process, a certain tolerance exists in a height between the valve body 11 and the circuit board 16, and in order to ensure that the conductive member 20b can be in contact with the valve body 11 and the circuit board 16, a precision requirement for a height of the conductive member 20b is needed. However, in this embodiment, the conductive member 20b is the elastic element, on the one hand, it is advantageous to reduce the machining accuracy of the conductive member 20b in a height direction of the conductive member 20b; and on the other hand, it is advantageous to improve the reliability of the contact between the conductive member 20b and the valve body 11. Other features in this embodiment can be referred to that of the electric valve of the first embodiment and will not be repeated herein.

Figure 27:
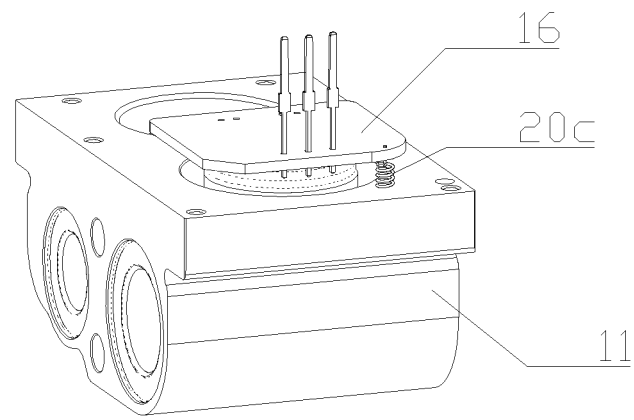
FIG. 27 is a perspective view of a valve body, a circuit board, a first pin, a second pin, a third pin, and a conductive member of FIG. 13 being combined according to a fourth embodiment of the present application.
Figure 28:
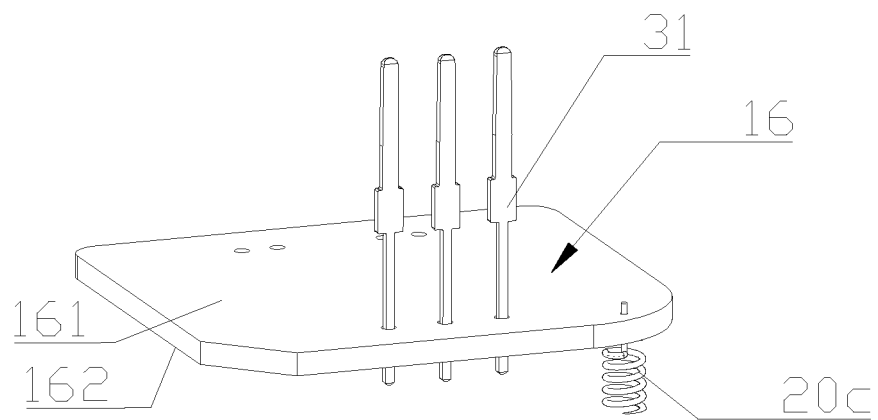
FIG. 28 is a perspective view of the circuit board, the first pin, the second pin, the third pin, and the conductive member of FIG. 27 being combined.
Figure 29:
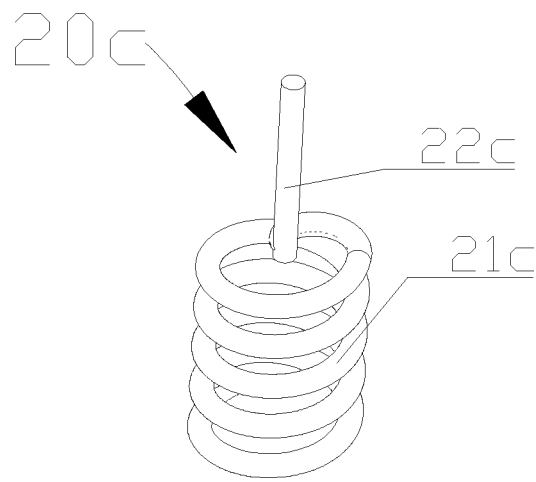
FIG. 29 is a perspective view of the conductive member of FIG. 27 or FIG. 28.
Figure 30:
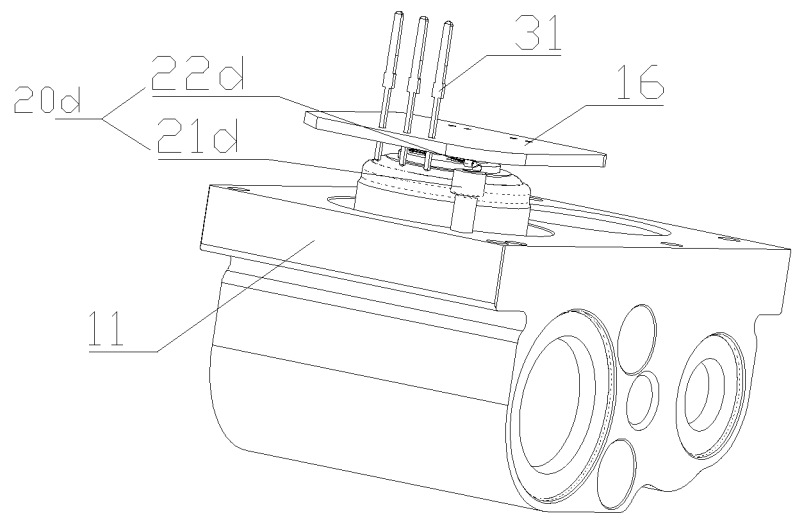
FIG. 30 is a perspective view of a valve body, a circuit board, a first pin, a second pin, a third pin, and a conductive member of FIG. 13 being combined according to a fifth embodiment of the present application.

Referring to FIG. 27 to FIG. 29, FIG. 27 is a structure diagram of a valve body 11, a circuit board 16, and a conductive member 20c being combined according to a fourth embodiment of the present application; FIG. 28 is a structure diagram of a conductive member 20c, a first pin 31, a second pin 32, and a third pin 33 being combined; and FIG. 29 is a structure diagram of the conductive member 20c of FIG. 19 and FIG. 20. The structure of the conductive member 20c of the fourth embodiment is described in detail below.

Referring to FIG. 27 to FIG. 29, in this embodiment, the conductive member 20c passes through the circuit board 16 and is fixedly connected to the circuit board 16. In an embodiment, one end of the conductive member 20c passes through the first surface 161 and the second surface 162 of the circuit board 16 and is fixedly connected to the circuit board 16. The one end of the conductive member 20c is electrically connected to the reference ground of the circuit board 16, and the other end of the conductive member 20c is in contact with the valve body 11. Specifically, referring to FIG. 20 and FIG. 22, in this embodiment, the conductive member 20c includes an elastic section 21c and an inelastic section 22c, the elastic section 21c is fixedly connected to the inelastic section 22c, and the inelastic section 22c passes through the first surface 161 and the second surface 162 of the circuit board 16 and is fixedly connected to the circuit board 16. Of course, the inelastic section 22c may only pass through the second surface 162 of the circuit board 16 but not pass through the first surface 161 of the circuit board 16. In this embodiment, the elastic section 21c is a spring, and a length of the elastic section 21c between the circuit board 16 and the valve body 11 is less than a length of the elastic section 21c in a natural state. Of course, the elastic section 21c may also be a reed, a resilient piece, a leaf spring, or other elastic structures. Generally, in the assembly process, a certain tolerance exists in the height between the valve body 11 and the circuit board 16, and in order to ensure that the conductive member 20c can be in contact with the valve body 11 and the circuit board 16, a precision requirement for a height of the conductive member 20c is needed. However, in this embodiment, since the conductive member 20c includes the elastic section 21c, on the one hand, it is advantageous to reduce the machining accuracy of the conductive member 20c in the height direction of the conductive member 20c; and on the other hand, it is advantageous to improve the reliability of the contact between the conductive member 20c and the valve body 11. In addition, in this embodiment, a portion fixedly connected to the circuit board 16 is the inelastic section 22c of the conductive member 20c, a portion abutting the valve body 11 is the elastic section 21c of the conductive member 20c. Of course, the portion fixedly connected to the circuit board 16 may also be the elastic section 21c of the conductive member 20c, and the portion abutting the valve body 11 may be the inelastic section 22c of the conductive member 20c. In this case, a fixing method of the conductive member 20c may be referred to that of the conductive member of the third embodiment in the present application and will not be repeated herein. Other features in this embodiment can be referred to that of the electric valve the first embodiment and will not be repeated herein.

Figure 31:
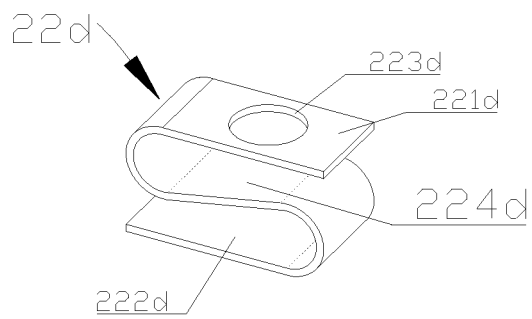
FIG. 31 is a perspective view of a conductive portion of FIG. 30.
Figure 32:
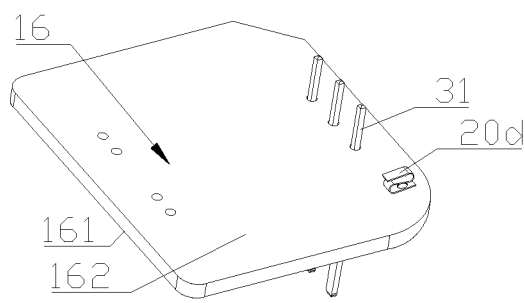
FIG. 32 is a perspective view of the circuit board, the first pin, the second pin, the third pin, and the conductive portion of FIG. 30 being combined.
Figure 33:
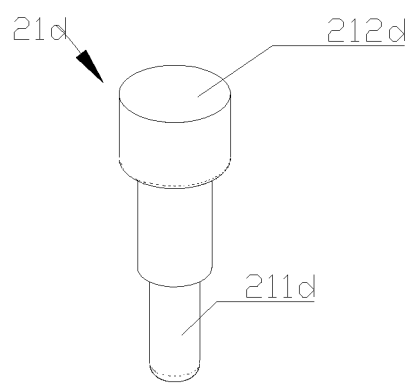
FIG. 33 is a perspective view of a support portion of FIG. 30.
Figure 34:
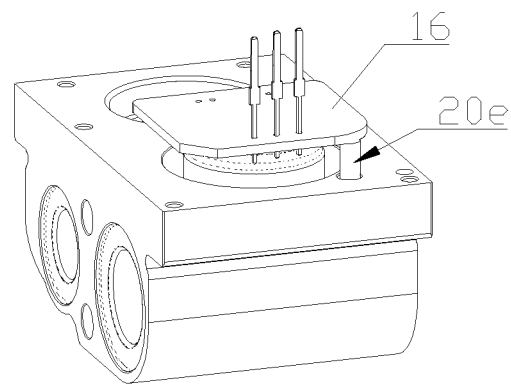
FIG. 34 is a perspective view of a valve body, a circuit board, a first pin, a second pin, a third pin, and a conductive member of FIG. 13 being combined according to a first embodiment of the present application.

Referring to FIG. 30 to FIG. 33, FIG. 30 is a structure diagram of a valve body 11, a circuit board 16, and a conductive member 20d being combined according to a fifth embodiment of the present application; FIG. 31 is a structure diagram of a conductive portion 22d of FIG. 30; FIG. 32 is a structure diagram of the conductive portion 22d, a first pin 31, a second pin 32, a third pin 33, and a circuit board 16 being combined; and FIG. 33 is a structure diagram of a support portion 21d of FIG. 30. The structure of the conductive member 20d of the fifth embodiment is described in detail below.

Referring to FIG. 30 to FIG. 33, in this embodiment, the conductive member 20d includes a support portion 21d and a conductive portion 22d, the support portion 21d and the conductive portion 22d are two separate components, and the support portion 21d is fixedly connected to the valve body 11. In an embodiment, referring to FIG. 30 to FIG. 33, the support portion 21d includes a connecting portion 211d. In conjunction with FIG. 14, the valve body 11 is formed with the connecting hole 115, the connecting hole 115 extends from the upper surface of the valve body 11 in the direction facing away from the upper surface of the valve body 11, and the connecting portion 211d is tightly fitted with and connected to the connecting hole 115. Of course, the connecting portion 211d may also be threadedly connected to the connecting hole 115 of the valve body 11, the connecting portion 211d is formed with external threads and the connecting hole 115 is formed with internal threads, and the external threads and the internal threads are fitted to each other to achieve a fixed connection. When the support portion 21d is threadedly connected to the valve body 11, the support portion 21d may be a bolt or a screw, which is beneficial to saving the manufacturing cost. In this embodiment, the fixing method between the support portion 21d and the valve body 11 may be referred to the fixing method between the conductive member and the valve body in the first embodiment and will not be repeated herein.

Referring to FIG. 30 to FIG. 33, the support portion 21d, the conductive portion 22d, and the valve body 11 are made of metal materials, at least one end of the conductive portion 22d is fixed, the conductive portion 22d is electrically connected to the reference ground of the circuit board 16, and the reference ground of the circuit board 16 and the valve body 11 can be electroconductive through the support portion 21d and the conductive portion 22d. In this way, it is beneficial to lead out static electricity from the valve body 11, thereby facilitating the reduction of the influence of the static electricity on the electric valve and facilitating the improvement of the electromagnetic compatibility of the electric valve.

Referring to FIG. 30 to FIG. 33, in this embodiment, one end of the conductive portion 22d is fixedly connected to the circuit board 16 and electrically connected to the reference ground of the circuit board 16. In an embodiment, the circuit board 16 includes a first surface 161 and a second surface 162, the first surface 161 faces away from the valve body 11, and the second surface 162 faces towards the valve body. Referring to FIG. 31 and FIG. 32, the conductive portion 22d includes a first connecting end 221d and a second connecting end 222d, and the first connecting end 221d is in contact with and fixedly connected to the second surface 162 of the circuit board 16. In this way, the conductive portion 22d is fixedly connected to the circuit board 16 in the surface-mount mode, thereby facilitating the simplification of the assembly process of the conductive portion 22d. The first connecting end 221d of the conductive portion 22d is electrically connected to the reference ground of the circuit board 16, and the second connecting end 222d abuts against an upper surface 212d of the support portion 21d, such that the reference ground of the circuit board 16, the conductive portion 22d, and the support portion 21d are electroconductive. In this embodiment, the conductive portion 22d is fixedly connected to the circuit board 16. The conductive portion 22d may also be fixedly connected to the support portion 21d, the second connecting end 222d of the conductive portion 22d is fixedly connected to the support portion 21d, and the first connecting end 221d of the conductive portion 22d abuts against the circuit board 16. In this case, the circuit board 16 includes an abutment portion. The abutment portion is described with reference to the abutment portion of the circuit board in the first embodiment and will not be repeated herein.

Referring to FIG. 30 to FIG. 33, in this embodiment, the conductive portion 22d is an elastic element. The conductive portion 22d further includes a middle portion 224d having a plate shape, and the middle portion 224d is disposed between the first connecting end 221d and the second connecting end 222d. The first connecting end 221d, the middle portion 224d, and the second connecting end 222d are sequentially distributed at intervals; in other words, a certain distance exists between the first connecting end 221d and the middle portion 224d and a certain distance exists between the second connecting end 222d and the middle portion 224d. The middle portion 224d and the first connecting end 221d are smoothly and transitionally connected through a circular arc, and the middle portion 224d and the second connecting end 222d are smoothly and transitionally connected through a circular arc, thus facilitating elastic deformation of the elastic element. In this embodiment, the conductive portion 22d includes only one middle portion 224d. Of course, two or more middle portions 224d may be provided between the first connecting end 221d and the second connecting end 222d, and adjacent middle portions 224d are connected end to end. Herein, reference may be made to the conductive member of the third embodiment.

In addition, the conductive portion 22d in this embodiment may also be a spring, a leaf spring, or other elastic elements. When the circuit board 16 is assembled, since the circuit board 16 is fixedly connected to the conductive portion 22d, the conductive portion 22d is compressed and deformed under the force of the circuit board 16, and thus the conductive portion 22d is elastically deformed, in other words, a length of the conductive portion 22d between the circuit board 16 and the support portion 21d is less than a length of the conductive portion 22d in a natural state. In this way, on the one hand, it is advantageous to improve the reliability of the contact between the conductive portion 22d and the support portion 21d; and on the other hand, it is advantageous to reduce the machining accuracy of the support portion 21d in a height direction of the support portion 21d. In an embodiment, the length of the conductive portion 22d between the circuit board 16 and the support portion 21d is 0.7 or 0.8 times the length of the conductive portion 22d in the natural state. In this way, on the premise that the conductive portion 22d is in reliable contact with the support portion 21d, it is beneficial to relatively control the elastic force of the conductive portion 22d, and thereby it is beneficial to relatively control the reactive force of the conductive portion 22d acting on the circuit board 16.

Referring to FIG. 31, the first connecting end 221d and the second connecting end 222d are plate-shaped, the first connecting end 221d is disposed in parallel and opposite to the second connecting end 222d, and the first connecting end 221d has a through hole 223d that penetrates through an upper surface and a lower surface of the first connecting end 221d. In this way, when the conductive portion 22d is fixed to the circuit board 16 by welding, a contact area between the solder and the conductive portion 22d can be increased, thereby facilitating the improvement of the reliability of the connection between the conductive portion 22d and the circuit board 16.

Figure 35:
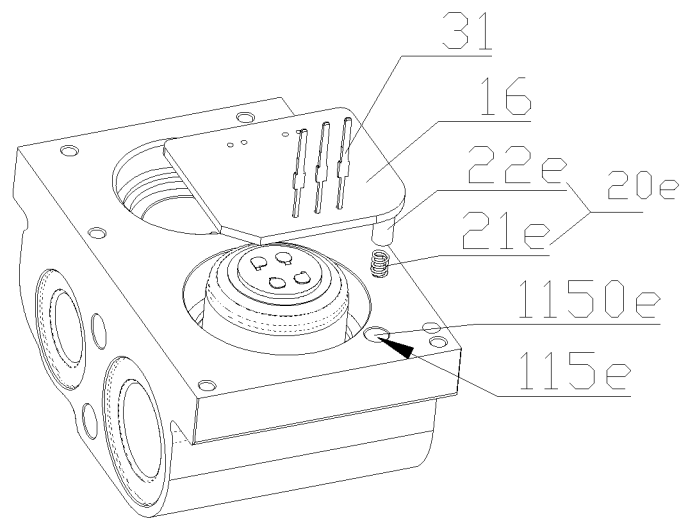
FIG. 35 is an exploded structure diagram of FIG. 34.
Figure 36:
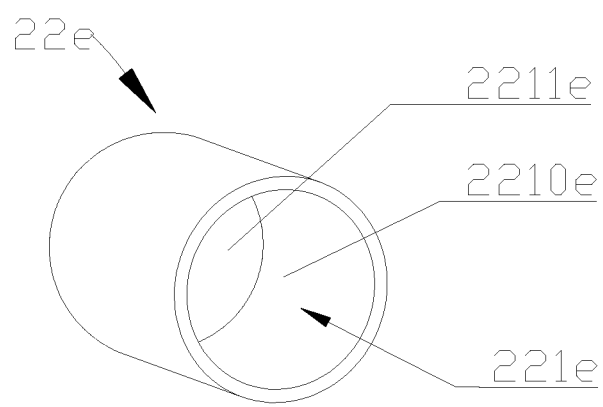
FIG. 36 is a perspective view of a conductive portion of FIG. 34 or FIG. 35.
Figure 37:
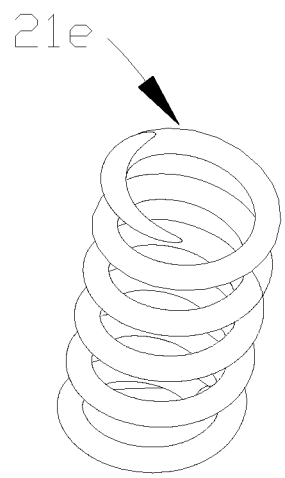
FIG. 37 is a perspective view of a support portion of FIG. 34 or FIG. 35.
Figure 38:
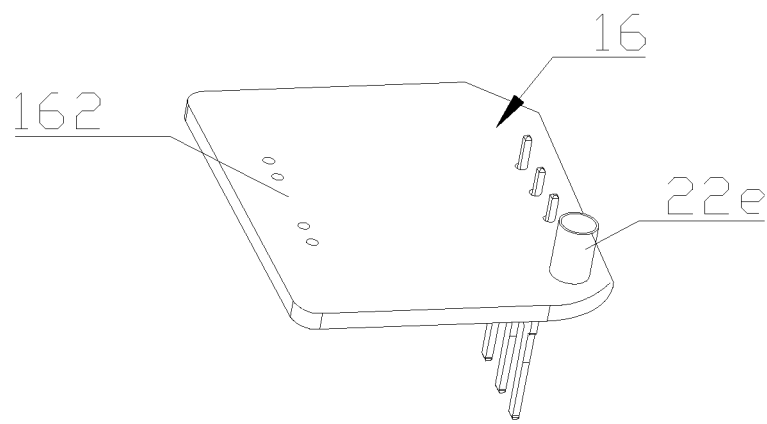
FIG. 38 is a perspective view of the circuit board, the first pin, the second pin, the third pin, and the conductive portion of FIG. 34 or FIG. 35 being combined.
Figure 39:
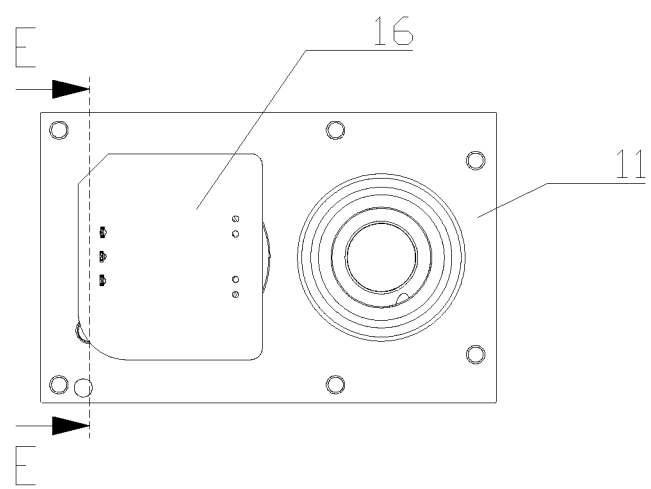
FIG. 39 is a front view of FIG. 34.
Figure 40:
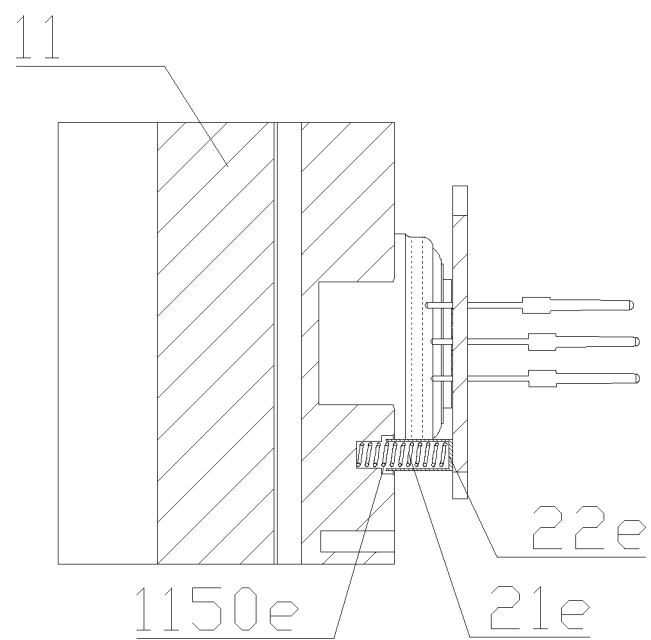
FIG. 40 is a cross-sectional view taken along a line E-E of FIG. 39.

Referring to FIG. 34 to FIG. 40, FIG. 35 is a structure diagram of a valve body 11, a circuit board 16, and a conductive member 20e being combined according to a sixth embodiment of the present application; FIG. 36 is a structure diagram of the conductive portion 22e of FIG. 35. FIG. 37 is a structure diagram of a support portion 21e of FIG. 35; and FIG. 38 is a structure diagram of the conductive portion 22e, a first pin 31, a second pin 32, a third pin 33, and a circuit board 16 being combined. The structure of the conductive member 20e of the sixth embodiment is described in detail below.

Referring to FIG. 34 to FIG. 40, the conductive member 20e includes the support portion 21e and the conductive portion 22e, the support portion 21e and the conductive portion 22e are two separate components, and the conductive portion 22e is electrically connected to the reference ground of the circuit board 16. In this embodiment, the support portion 21e is an elastic element, and the conductive portion 22e is an inelastic element. In an embodiment, the support portion 21e is a spring. Of course, the support portion 21e may also be a reed, a resilient piece, a leaf spring, or other elastic structures. In this embodiment, the support portion 21e is limited on the valve body 11, the conductive portion 22e is sleeved around an outer periphery of the support portion 21e, and the conductive portion 22e is fixedly connected to the second surface 162 of the circuit board 16 by welding. In an embodiment, the conductive portion 22e includes a first accommodation portion 221e having a first accommodation cavity 2210e, and at least a part of the support portion 21e is arranged in the first accommodation cavity 2210e. Referring to FIG. 35, the valve body 11 includes a second accommodation portion 115e having a second accommodation cavity 1150e, and at least a part of the support portion 21e is arranged in the second accommodation cavity 1150e so as to achieve the limiting of the support portion 21e. One end of the support portion 21e is in contact with a top inner wall 2211e of the first accommodation portion 221e of the conductive portion 22e, and the other end of the support portion 21e is in contact with a bottom surface of the second accommodation portion 115e of the valve body 11. The conductive portion 22e is electrically connected to the reference ground of the circuit board 16, one end of the support portion 21e is in contact with the conductive portion 22e, and the other end of the support portion 21e is in contact with the valve body 11, such that the reference ground of the circuit board 16 and the valve body 11 can be electroconductive through the support portion 21e and the conductive portion 22e, which facilitates the improvement of the electromagnetic compatibility of the electric valve. Referring to FIG. 32 and FIG. 33, a part of the conductive portion 22e is disposed in the second accommodation cavity 1150e of the valve body 11 and in clearance fit with an inner wall of the second accommodation portion 115e of the valve body. In this way, when the circuit board 16 is assembled, the part of the conductive portion 22e is disposed in the second accommodation cavity 1150e of the valve body 11 such that the conductive portion 22e can be pressed against the support portion 21e, and thereby the support portion 21e can be elastically deformed in an axial direction of the support portion 21e. In this embodiment, the conductive portion 22e is fixedly connected to the circuit board 16 by welding. Of course, the conductive portion 22e may also be fixedly connected to the support portion 21e. In an embodiment, the support portion 21e is in contact with and fixedly connected to a bottom surface 2211e of the first accommodation portion 221e of the conductive portion 22e, and the circuit board 16 includes an abutment portion. The abutment portion is described with reference to the abutment portion in the first embodiment and will not be repeated herein.

Figure 41:
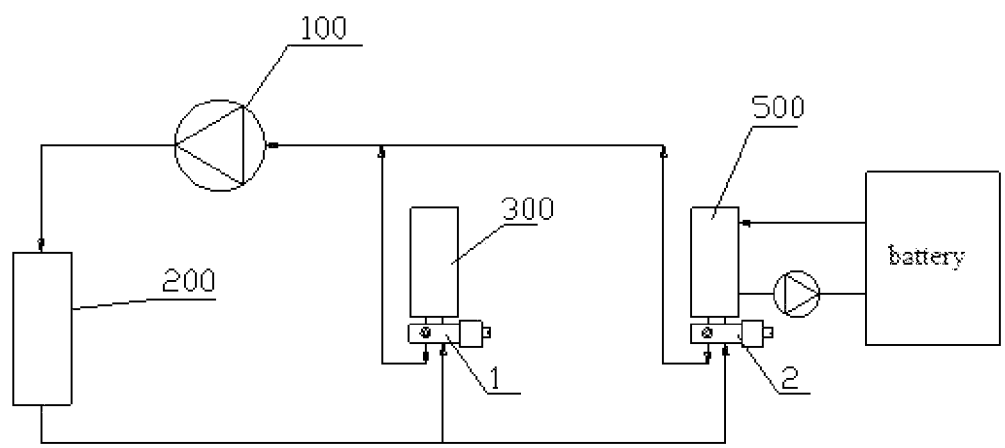
FIG. 41 is a block diagram of an air conditioning system according to one embodiment of the present application.

An embodiment of the present application further provides an air conditioning system. Referring to FIG. 41, FIG. 41 is a block diagram of an air conditioning system according to one embodiment. In the air conditioning system, the electric valve is configured to control a flow rate of the refrigerant, and a degree of superheat of the air conditioning system is controlled by adjusting the flow rate of the refrigerant. The electric valve controls an opening degree based on an electric signal so as to control the flow rate of the refrigerant. In order to improve control accuracy of the flow rate, the electric valve is gradually used as a throttling element in an automobile air conditioning system, a heat pump system, and a battery cooling system and the like. Referring to FIG. 41, in this embodiment, the air conditioning system includes a compressor 100, a condenser 200, a first electric valve 3, and an evaporator 300. The first electric valve 3 is disposed at an outlet of the evaporator 300. The first electric valve 3 is configured to control a flow rate of a working medium at the outlet of the evaporator 300. When the air conditioning system works, the refrigerant is compressed into a high-temperature and high-pressure refrigerant by the compressor 100, the high-temperature and high-pressure refrigerant is radiated through the condenser 200 and becomes a normal-temperature and high-pressure refrigerant, and the normal-temperature and high-pressure refrigerant enters the evaporator 300 through the first electric valve 1. Since the pressure of the normal-temperature and high-pressure refrigerant decreases after passing through the first electric valve 3, the refrigerant vaporizes to become a low-temperature refrigerant, and the low-temperature refrigerant absorbs a large amount of heat through the evaporator 300 to become a refrigerant and returns to the compressor 100. The air conditioning system further includes a battery assembly, a heat exchanger 500, and a second electric valve 2, and heat exchange is performed between the refrigerant and the working medium of the battery assembly in the heat exchanger 500. In this embodiment, the structure of the first electric valve 3 is the same as the structure of the second electric valve 2. Of course, the structure of the first electric valve 3 and the structure of the second electric valve 2 may be different, and the structure of at least one of the first electric valve 3 and the second electric valve 2 may refer to the electric valve provided in any one of the above-mentioned embodiments of the present application.

Figure 42:
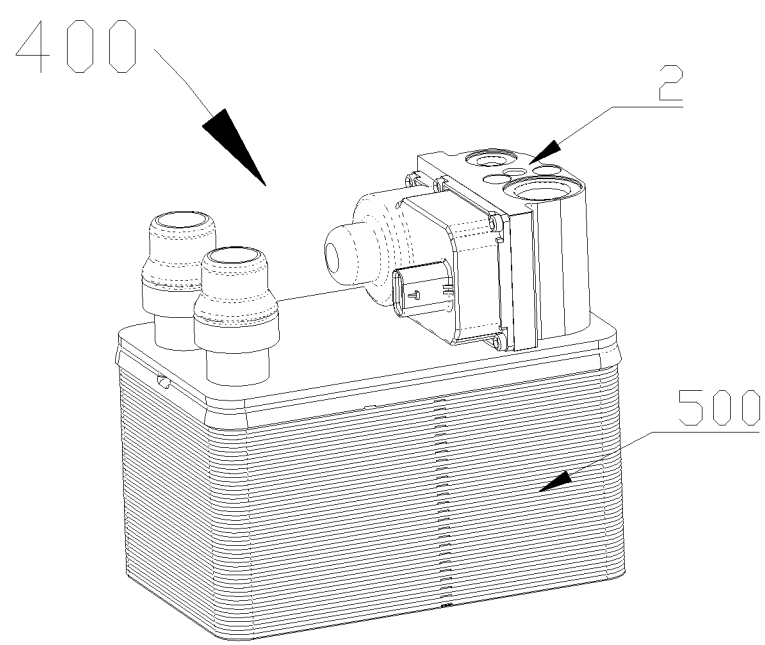
FIG. 42 is a perspective view of a thermal management assembly according to one embodiment of the present application.

An embodiment of the present application further provides a thermal management assembly. Referring to FIG. 42, FIG. 42 is a structure diagram of a thermal management assembly according to one embodiment. In this embodiment, the thermal management assembly 400 includes the heat exchanger 500 and the second electric valve 2, and the heat exchanger 500 and the second electric valve 2 are integrated into a whole. The structure of the second electric valve 2 may refer to the electric valve provided in any one of the above-mentioned embodiments of the present application.

What is claimed is:

1. An electric valve, comprising a valve body, a circuit board, a sensor, and a conductive member; wherein
the valve body is provided with a passage, the sensor is connected to the circuit board in at least one of an electric connection mode or a signal connection mode, and the sensor is configured to detect at least one of a pressure or a temperature of a working medium in the passage;
at least one of the following components of the electric valve comprises a metal portion: the valve body or a housing of the sensor, and a reference ground of the circuit board is electrically connected directly or indirectly to the metal portion; and
the conductive member and the valve body are electroconductive, at least part of the conductive member is arranged between the circuit board and the valve body, at least part of the conductive member is electrically connected to the reference ground of the circuit board, at least part of the conductive member is in contact with the valve body, and an electrical conduction between the reference ground of the circuit board and the valve body is formed through the conductive member.

2. The electric valve of claim 1, wherein the sensor comprises a first electromagnetic compatibility adjustment unit and a sensor ground, and the sensor ground is electrically connected to the metal portion of the housing of the sensor through the first electromagnetic compatibility adjustment unit; and
the reference ground of the circuit board is electrically connected to the sensor ground of the sensor.

3. The electric valve of claim 2, wherein the circuit board further comprises a second electromagnetic compatibility adjustment unit; and
a first end of the second electromagnetic compatibility adjustment unit is electrically connected to the reference ground, and a second end of the second electromagnetic compatibility adjustment unit is electrically connected to the metal portion of the housing of the sensor; or
the housing of the sensor is fixedly connected to the valve body, the first end of the second electromagnetic compatibility adjustment unit is electrically connected to the reference ground, and the second end of the second electromagnetic compatibility adjustment unit is electrically connected to a metal portion of the valve body.

4. The electric valve of claim 1, wherein the circuit board further comprises a second electromagnetic compatibility adjustment unit; and
   a first end of the second electromagnetic compatibility adjustment unit is electrically connected to the reference ground, and a second end of the second electromagnetic compatibility adjustment unit is electrically connected to the metal portion of the housing of the sensor; or
   the housing of the sensor is fixedly connected to the valve body, the first end of the second electromagnetic compatibility adjustment unit is electrically connected to the reference ground, and the second end of the second electromagnetic compatibility adjustment unit is electrically connected to a metal portion of the valve body.

5. The electric valve of claim 1, wherein the sensor further comprises a first pin plugged into one end of the sensor, one end of the first pin is electrically connected to the metal portion of the housing of the sensor, and another end of the first pin is electrically connected to the reference ground of the circuit board.

6. The electric valve of claim 1, further comprising a motor connected to the valve body, wherein the motor comprises a coil;
   wherein the circuit board further comprises a power circuit, the power circuit is configured to supply power to the coil, a positive electrode of the power circuit is electrically connected to a first end of the coil, and a negative electrode of the power circuit is electrically connected to a second end of the coil; and
   wherein the power circuit comprises a third electromagnetic compatibility adjustment unit, and the third electromagnetic compatibility adjustment unit is connected in parallel to the coil.

7. The electric valve of claim 1, wherein a lower portion of the conductive member is fixedly connected to the valve body, and the conductive member and the valve body are both made of a conductive metal material; the circuit board comprises a first surface and a second surface, the first surface faces away from the valve body, and the second surface faces toward the valve body; and the circuit board further comprises an abutment portion, the abutment portion is arranged on the second surface and electrically connected to the reference ground of the circuit board, and an upper surface of an upper portion of the conductive member is in contact with the abutment portion and electrically connected to the abutment portion.

8. The electric valve of claim 1, wherein the conductive member and the valve body are both made of a conductive metal material; the circuit board comprises a first surface and a second surface, the first surface faces away from the valve body, and the second surface faces toward the valve body; and one end of the conductive member is in contact with the valve body, and another end of the conductive member is fixedly connected to the second surface, or the conductive member sequentially passes through the second surface and the first surface of the circuit board and is fixedly connected to the circuit board.

9. The electric valve of claim 8, wherein a part of the at least part of the conductive member arranged between the circuit board and the valve body is an elastic section, and a length of the elastic section arranged between the circuit board and the valve body is less than a length of the elastic section in a natural state.

10. The electric valve of claim 1, wherein the conductive member comprises a support portion and a conductive portion, one end of the support portion is in contact with and fixedly connected to the valve body, or one end of the support portion is limited within and in contact with the valve body; one end of the conductive portion is in contact with another end of the support portion, another end of the conductive portion is in contact with the circuit board, and the conductive portion is electrically connected to the reference ground of the circuit board; and the support portion, the conductive portion, and the valve body are all made of a conductive metal material, and an electrical conduction between the reference ground of the circuit board and the valve body is formed through the support portion and the conductive portion.

11. The electric valve of claim 10, wherein the circuit board comprises a first surface and a second surface, the first surface faces away from the valve body, and the second surface faces toward the valve body; the one end of the conductive portion abuts against the another end of the support portion, the another end of the conductive portion is fixedly connected to the second surface of the circuit board, and the another end of the conductive portion is electrically connected to the reference ground of the circuit board.

12. The electric valve of claim 11, wherein the conductive portion is an elastic element, the support portion is an inelastic element, the elastic element is electrically connected to the reference ground of the circuit board, and a length of the elastic element between the circuit board and the support portion is less than a length of the elastic element in a natural state.

13. The electric valve of claim 11, wherein the support portion is an elastic element, the conductive portion is an inelastic element, and the conductive portion is sleeved on an outer periphery of at least part of the support portion; the conductive portion comprises a first accommodation portion having a first accommodation cavity, and the at least part of the support portion is arranged in the first accommodation cavity; the valve body comprises a second accommodation portion having a second accommodation cavity, and at least part of the support portion is arranged in the second accommodation cavity; and one end surface of the support portion is in contact with a top inner wall of the first accommodation portion of the conductive portion, and another end surface of the support portion is in contact with a bottom surface of the second accommodation portion.

14. The electric valve of claim 10, wherein the circuit board comprises a first surface and a second surface, the first surface faces away from the valve body, and the second surface faces toward the valve body; the circuit board further comprises an abutment portion arranged on a reference ground of the second surface of the circuit board; the one end of the conductive portion is fixedly connected to the another end of the support portion or the one end of the conductive portion is limited by the support portion; and the another end of the conductive portion abuts against the abutment portion of the circuit board and is electrically connected to the reference ground of the circuit board through the abutment portion.

15. The electric valve of claim 14, wherein the conductive portion is an elastic element, the support portion is an inelastic element, the elastic element is electrically connected to the reference ground of the circuit board, and a length of the elastic element between the circuit board and the support portion is less than a length of the elastic element in a natural state.

16. The electric valve of claim 14, wherein the support portion is an elastic element, the conductive portion is an inelastic element, and the conductive portion is sleeved on an outer periphery of at least part of the support portion; the conductive portion comprises a first accommodation portion having a first accommodation cavity, and the at least part of the support portion is arranged in the first accommodation cavity; the valve body comprises a second accommodation portion having a second accommodation cavity, and at least part of the support portion is arranged in the second accommodation cavity; and one end surface of the support portion is in contact with a top inner wall of the first accommodation portion of the conductive portion, and another end surface of the support portion is in contact with a bottom surface of the second accommodation portion.

17. A thermal management assembly, comprising an electric valve and a heat exchanger, wherein the electric valve is fixedly connected to the heat exchanger, and the electric valve comprises a valve body, a circuit board, a sensor, and a conductive member;
- wherein, the valve body is provided with a passage, the sensor is connected to the circuit board in at least one of an electric connection mode or a signal connection mode, and the sensor is configured to detect at least one of a pressure or a temperature of a working medium in the passage; and
- wherein, at least one of the following components of the electric valve comprises a metal portion: the valve body or a housing of the sensor, and a reference ground of the circuit board is electrically connected directly or indirectly to the metal portion; and
- wherein, the conductive member and the valve body are electroconductive, at least part of the conductive member is arranged between the circuit board and the valve body, at least part of the conductive member is electrically connected to the reference ground of the circuit board, at least part of the conductive member is in contact with the valve body, and an electrical conduction between the reference ground of the circuit board and the valve body is formed through the conductive member.

18. An air conditioning system, comprising an evaporator and an electric valve; wherein the electric valve comprises a valve body, a circuit board, a sensor, and a conductive member;
- wherein, the valve body is provided with a passage, the sensor is connected to the circuit board in at least one of an electric connection mode or a signal connection mode, and the sensor is configured to detect at least one of a pressure or a temperature of a working medium in the passage;
- wherein at least one of the following components of the electric valve comprises a metal portion: the valve body or a housing of the sensor, and a reference ground of the circuit board is electrically connected directly or indirectly to the metal portion;
- wherein, the conductive member and the valve body are electroconductive, at least part of the conductive member is arranged between the circuit board and the valve body, at least part of the conductive member is electrically connected to the reference ground of the circuit board, at least part of the conductive member is in contact with the valve body, and an electrical conduction between the reference ground of the circuit board and the valve body is formed through the conductive member, and
- wherein, the electric valve is arranged at an outlet of the evaporator, and the electric valve is configured to control a flow rate of a working medium at the outlet of the evaporator.

* * * * *